(12) United States Patent
Moddel

(10) Patent No.: US 11,133,758 B2
(45) Date of Patent: Sep. 28, 2021

(54) QUANTUM VACUUM FLUCTUATION DEVICES

(71) Applicant: The Regents of the University of Colorado, a body corporate, Denver, CO (US)

(72) Inventor: Garret Moddel, Boulder, CO (US)

(73) Assignee: The Regents of the University of Colorado, a body corporate, Denver, CO (US)

(*) Notice: Subject to any disclaimer, the term of this patent is extended or adjusted under 35 U.S.C. 154(b) by 0 days.

(21) Appl. No.: 16/855,890

(22) Filed: Apr. 22, 2020

(65) Prior Publication Data
US 2020/0358376 A1  Nov. 12, 2020

Related U.S. Application Data

(60) Provisional application No. 62/904,666, filed on Sep. 23, 2019, provisional application No. 62/920,636, filed on May 10, 2019.

(51) Int. Cl.
*H02N 11/00* (2006.01)
*H01L 49/00* (2006.01)

(52) U.S. Cl.
CPC ......... *H02N 11/008* (2013.01); *H01L 49/006* (2013.01); *H02N 11/002* (2013.01)

(58) Field of Classification Search
CPC .... H02N 11/002; H02N 11/008; H01L 49/006
USPC ..... 290/1 R; 244/171.1–171.9; 361/230–239
See application file for complete search history.

(56) References Cited

U.S. PATENT DOCUMENTS

| 5,590,031 | A  | * | 12/1996 | Mead, Jr. | ............... | H02M 11/00 |
|  |  |  |  |  |  | 342/6 |
| 6,477,028 | B1 | * | 11/2002 | Pinto | .................... | H02N 11/008 |
|  |  |  |  |  |  | 361/233 |
| 6,593,566 | B1 | * | 7/2003 | Pinto | ....................... | H02N 11/00 |
|  |  |  |  |  |  | 250/251 |
| 6,650,527 | B1 | * | 11/2003 | Pinto | ........................ | G21K 1/00 |
|  |  |  |  |  |  | 250/251 |

(Continued)

FOREIGN PATENT DOCUMENTS

WO    2000071894 A1    11/2000

OTHER PUBLICATIONS

Atar, et. al., 2013, "Plasmonically Enhanced Hot Electron Based Photovoltaic Device,",Optics Express 21:6, 7196-7201.

(Continued)

*Primary Examiner* — Pedro J Cuevas
(74) *Attorney, Agent, or Firm* — Kilpatrick Townsend & Stockton LLP

(57) ABSTRACT

Described herein are devices incorporating Casimir cavities, which modify the quantum vacuum mode distribution within the cavities. The Casimir cavities can drive charge carriers from or to an electronic device disposed adjacent to or contiguous with the Casimir cavity by modifying the quantum vacuum mode distribution incident on one side of the electronic device to be different from the quantum vacuum mode distribution incident on the other side of the electronic device. The electronic device can exhibit a structure that permits transport or capture of hot carriers in very short time intervals, such as in 1 picosecond or less.

81 Claims, 9 Drawing Sheets

(56) References Cited

U.S. PATENT DOCUMENTS

| | | | | |
|---|---|---|---|---|
| 6,665,167 | B2* | 12/2003 | Pinto | H02N 1/00 |
| | | | | 361/233 |
| 6,842,326 | B2* | 1/2005 | Pinto | H02N 1/00 |
| | | | | 361/233 |
| 6,920,032 | B2* | 7/2005 | Pinto | H02N 11/008 |
| | | | | 361/233 |
| 7,379,286 | B2 | 5/2008 | Haisch et al. | |
| 7,411,772 | B1* | 8/2008 | Tymes | H02N 11/008 |
| | | | | 307/151 |
| 8,039,368 | B2* | 10/2011 | Drndic | H01L 21/0337 |
| | | | | 438/478 |
| 8,317,137 | B2* | 11/2012 | Cormier | B64G 1/244 |
| | | | | 244/171.5 |
| 8,803,340 | B2 | 8/2014 | Moddel | |
| 8,913,366 | B1* | 12/2014 | Mezinis | H01T 23/00 |
| | | | | 361/230 |
| 9,581,142 | B2 | 2/2017 | Moddel | |
| 9,634,158 | B2* | 4/2017 | Kobayashi | H01L 27/14638 |
| 10,199,414 | B2* | 2/2019 | Kobayashi | H01L 27/14638 |
| 10,612,971 | B2* | 4/2020 | Huang | G01J 1/0407 |
| 2006/0027709 | A1* | 2/2006 | Pinto | B64G 1/409 |
| | | | | 244/171.1 |
| 2007/0007393 | A1* | 1/2007 | Pinto | B64G 1/409 |
| | | | | 244/171.5 |
| 2007/0241470 | A1* | 10/2007 | Haisch | H02N 11/002 |
| | | | | 264/1.27 |
| 2008/0296437 | A1* | 12/2008 | Cormier | F03H 99/00 |
| | | | | 244/171.5 |
| 2009/0322221 | A1* | 12/2009 | Makansi | H01J 1/88 |
| | | | | 313/523 |
| 2010/0142259 | A1* | 6/2010 | Drndic | B82Y 10/00 |
| | | | | 365/158 |
| 2010/0237198 | A1* | 9/2010 | Cormier | F03H 99/00 |
| | | | | 244/171.5 |
| 2013/0283797 | A1* | 10/2013 | Bressi | F01B 29/00 |
| | | | | 60/698 |
| 2014/0092520 | A1* | 4/2014 | Rosendorf | H02N 11/008 |
| | | | | 361/233 |
| 2014/0092521 | A1* | 4/2014 | Rosendorf | H02N 11/008 |
| | | | | 361/233 |
| 2014/0158887 | A1* | 6/2014 | Rosendorf | H02N 11/008 |
| | | | | 250/338.3 |
| 2014/0158906 | A1* | 6/2014 | Rosendorf | H02N 11/008 |
| | | | | 250/438 |
| 2014/0353577 | A1* | 12/2014 | Agarwal | H01L 49/006 |
| | | | | 257/10 |
| 2014/0374865 | A1* | 12/2014 | Kobayashi | H01L 23/5386 |
| | | | | 257/435 |
| 2017/0199078 | A1* | 7/2017 | Huang | G01J 1/0407 |
| 2017/0338355 | A1* | 11/2017 | Kobayashi | H01L 31/02016 |
| 2018/0059704 | A1 | 3/2018 | Villalobos | |
| 2019/0207521 | A1* | 7/2019 | Bressi | H02N 11/008 |
| 2020/0011978 | A1* | 1/2020 | Chu | G01S 17/36 |
| 2020/0357997 | A1* | 11/2020 | Moddel | H01L 39/14 |
| 2020/0358375 | A1* | 11/2020 | Moddel | H01L 49/006 |
| 2020/0395872 | A1* | 12/2020 | Moddel | C25B 9/17 |

OTHER PUBLICATIONS

Blandford and Thome, 2008, "Applications of Classical Physics," Lecture Notes Chapter 6, California Institute of Technology, Version 12.

Brongersma, et. al., (Eds.), 2007, "Surface Plasmon Nanophotonics", (vol. 131); Springer.

Brongersma, 2015, "Plasmon-Induced Hot Carrier Science and Technology", Nature Nanotechnology, 10:1,25-34.

Chalabi, et al., 2014, "Hot-Electron Photodetection with a Plasmonic Nanostripe Antenna," Nano Lett., 14:3, 1374-1380.

Clavero, 2014, "Plasmon Induced Hot-Electron Generation at Nanoparticle/Metal-Oxide Interfaces for Photovoltaic and Photocatalytic Devices," Nature Photonics, 8:2, 95-103.

Cowell, William E., et. al., "Barrier Height Estimation of Asymmetric Metal-Insulator-Metal-Tunneling Diodes", J. Appl. Phys., 114:213703, (2013).

Du,et. al., 2013, "Ultrafast Plasmon Induced Electron Injection Mechanism in Gold-Ti02 Nanoparticle System." J. Photochem. and Photobiol. C: Photochem. Revs., 15, 21-30.

Gall, 2016, "Electron Mean Free Path in Elemental Metals," J. Appl. Phys., 119:8, 085101.

Genet, et. al., 2003, "Casimir Force and the Quantum Theory of Lossy Optical Cavities," Phys. Rev. A, 67:4, 043811.

Gong, et. al., 2007, "Design of Plasmonic Cavities for Solid-State Cavity Quantum Electrodynamics Applications," Appl. Phys. Lett., 90:3, 033113., (abstract only).

Grover, S., et. al., "Metal Single-Insulator and Multi-Insulator Diodes for Rectenna Solar Cells", 21 pgs.

Helman, et. al., 1973, "Theory of Internal Photoemission," Phys. Rev. B, 7:8, 3702.

Herner, et. al., 2017, "High Performance MIIM Diode Based on Cobalt Oxide/Titanium Oxide," Appl. Phys. Lett., 110, 223901.

Jiang, et. al., 2017, "Photoelectrochemical Devices for Solar Water Splitting-Materials and Challenges,", Chem. Soc. Rev., 46:15, 4645-4660.

John, et. al., 2017, "Optical Properties of Graphene, Silicene, Germanene, and Stanine from IR to Far UV—a First Principles Study," J. Phys. and Chem. of Solids, 110, 307-315. (abstract only).

Kish, 2005, "Stealth Communication: Zero-Power Classical Communication, Zeroquantum Quantum Communication and Environmental-Noise Communication," Appl. Phys. Lett.,87:23, 234109.

Kish, et al., 2016, "Zero-Point Term and Quantum Effects in the Johnson Noise of Resistors: a Critical Appraisal," J. Stat. Mech.: Theory and Experiment, 2016:5, 054006.

Knight, et. al., 2013, "Embedding Plasmonic Nanostructure Diodes Enhances Hot Electron Emission," Nano Lett., 13:4, 1687-1692. (abstract only).

Kodama, et. al., 2001, "Fast Heating of Ultrahigh-Density Plasma as a Step Towards Laser Fusion Ignition," Nature, 412:6849, 798.

Lambe, et. al., 1976, "Light Emission From Inelastic Electron Tunneling," Phys. Rev.Lett., 37:14, 923.

Lebedev et al., 1999, "The dynamics of wire array Z-pinch implosions," Phys. of Plasmas, 6:5, 2016-2022. (abstract only).

Li, Rengui, 2017, "Latest Progress in Hydrogen Production from Solar Water Splitting Via Photocatalysis, Photoelectrochemical, and Photovoltaic-Photoelectrochemical Solutions,", Chinese Journal of Catalysis, 38:1,5-12. (abstract only).

McCarthy, et. al., 1977, "Enhancement of Light Emission from Metal-Insulator-Metal Tunnel Junctions," Appl. Phys. Lett., 30:8, 427-429.

Mizuguchi, et. al., 2007, "Simulation of High-Energy Proton Production by Fast Magnetosonic Shock Waves in Pinched Plasma Discharges," Phys. of Plasmas, 14:3, 032704.

Moddel, G. and Dmitriyeva, O., 2019, "Extraction of Zero-Point Energy from the Vacuum: Assessment of Stochastic Electrodynamics-Based Approach as Compared to Other Methods," Atoms, 7(2), 51.

Moddel, G., "Will Rectenna Solar Cells Be Practical?", 22 pgs. (2013).

Ozawa, et al., 2007, "Preparation and Characterization of the Eu3+ Doped Perovskite Nanosheet Phosphor: Lao.90Euo.osNb207," Chemistry of Materials, 19:26, 6575-6580.

Sze, et. al., 2006, "Physics of Semiconductor Devices," John Wiley & Sons, p. 682.

Van Dorp, et. al., 2009, "SiC: a Photocathode for Water Splitting and Hydrogen Storage," Angewandte Chemie Intl. Ed., 48:33, 6085-6088.

Viswanath, e.t al., 2019, "A Nanosheet Phosphor of Double-Layered Perovskite with Unusual Intrananosheet Site Activator Concentration," Chem. Eng. J., 122044.

Wang, et. al., 2000, "Light Emission From the Double-Barrier Al/Ah03/Al/Ah03/Au Tunnel Junction," Thin Solid Films, 371:1-2, 191-194.

Wang, et. al., 2011, "Plasmonic Energy Collection Through Hot Carrier Extraction," Nano Lett., 11: 12, 5426-5430. (abstract only).

(56) References Cited

OTHER PUBLICATIONS

Wang, et. al., 2017, "Field-Assisted Splitting of Pure Water Based on Deep-Sub-Debyelength Nanogap Electrochemical Cells," ACS Nano, 11:8, 8421-8428.
Walter, et. al., 2010, "Solar Water Splitting Cells," Chem. Rev. 110: 11, 6446-6473.
Yam, P., "Exploiting Zero-Point Energy", Scientific American, Scientific American, Inc., New York, NY, US, vol. 277, No. 6, Dec. 1, 1997 (Dec. 1, 1997) pp. 54-57.
Zhu, 2014, "Graphene Geometric Diodes for Optical Rectennas," PhD Thesis, University of Colorado, 68-77.
Zhu, et. al., 2019, "Graphene Geometric Diodes for Terahertz Rectennas", J. Phys. D: Appl. Phys., 46, 185101.
International Search Report and Written Opinion dated Jul. 31, 2020 in related application No. PCT/IB2020/054254, all pgs.
International Search Report and Written Opinion dated Aug. 3, 2020 in related application No. PCT/IB2020/054255, all pgs.
International Search Report and Written Opinion dated Sep. 22, 2020 in application No. PCT/US2020/032251, all pgs.
Visser, et. al.: II Follow Up: "What is the 'Zero-Point Energy' (or 'vacuum energy 1) in Quantum Physics? Is it Really Possible That We Could Harness This Energy?" 11, Scientific American, Aug. 18, 1997 (Aug. 18, 1997), XP055728009.
Moddel, et. al., Extraction of Zero-Point Energy from the Vacuum: Assessment of Stochastic Electrodynamics-Based Approach as Compared to Other Methods, Atoms, vol. 7, No. 2, May 23, 2019 (May 23, 2019), p. 51, XP055728056, ISSN: 2218-2004, DOI: 10.3390/atoms7020051.
Dmitriyeva, et. al.,:"Test of Zero-point Energy Emission from Gases Flowing Through Casimir Cavities", Physics Procedia, x A vol. 38, Nov. 8, 2012 (Nov. 8, 2012), pp. 8-17, XP028514995, ISSN: 1875~3892, DOI: 10.1016/J.PHPR0.2012.08.007.
International Search Report and Written Opinion dated Nov. 5, 2020 in application No. PCT/IB2020/054256, all pgs.
Francesco Intravaia, et. al.: "Strong Casimir Force Reduction Through Metallic Surface Nanostructuring", Nature Communications, vol. 4, No. 1, Sep. 27, 2013 (Sep. 27, 2013).

\* cited by examiner

QUANTUM VACUUM FLUCTUATION DEVICES

CROSS REFERENCE TO RELATED APPLICATIONS

This application claims the benefit of and priority to U.S. Provisional Application No. 62/904,666, filed on Sep. 23, 2019, and U.S. Provisional Application No. 62/920,636, filed on May 10, 2019, which are hereby incorporated by reference in their entireties.

FIELD

This invention is in the field of electronic devices. This invention relates generally to quantum devices for harvesting and generating electrical energy.

BACKGROUND

According to quantum theory the quantum vacuum is filled with electromagnetic radiation in the form of quantum vacuum fluctuations. There has been substantial discussion about whether this energy can be harvested, and if so, how. A chief problem in harvesting this energy is that it forms the energy ground state, and so it does not flow from one region to another. However, the quantum vacuum energy is geometry-dependent, and its density is lower in a Casimir cavity than outside of a Casimir cavity. The use of Casimir cavities therefore opens the possibility of making use of the quantum vacuum fluctuations to drive energy from one location to another.

SUMMARY

Devices for generation of electrical energy are described herein. In embodiments, devices described herein use two different regions in which the energy density of the quantum vacuum is different to drive energy across an electronic device such that a portion of it can be harvested.

In an aspect, devices are disclosed for generation and capture of charge carriers that are excited by quantum vacuum fluctuations. Devices of this aspect may use an asymmetry in quantum vacuum fluctuations with respect to an electronic device to drive a flow of energy or particles or waves across the electronic device. Devices of this aspect may also or alternatively comprise an electronic device having a structure permitting fast transport and/or capture of a charge carrier excited by quantum vacuum fluctuations. In some embodiments, a device of this aspect may be referred to as a Casimir photoinjector or a Casimir photoinjector device.

An example device of this aspect may comprise an electronic device and a zero-point-energy-density-reducing structure adjoining the electronic device. Devices of this aspect may optionally be connected to a load positioned to receive electric current from one or more electrically conductive layers of the electronic device. In embodiments, the zero-point-energy-density-reducing structure provides an asymmetry with respect to the electronic device that drives a flow of energy or particles or waves across the electronic device. The devices disclosed herein are distinguished from solar cells, photodiodes, or other devices that convert light from an external illumination source into an electrical current and are capable of producing a flow of energy or particles or waves that occurs even in the absence of external sources of illumination. Stated another way, the disclosed devices are capable of producing power whether in dark conditions or in light conditions.

The asymmetry noted above may produce a voltage difference between a first side of the electronic device and a second side of the electronic device. The asymmetry may produce a net charge flow between a first side of the electronic device and a second side of the electronic device. The asymmetry may provide a reduction in a zero-point energy density on a first side of the electronic device as compared to the zero-point energy density on the first side of the electronic device in an absence of the zero-point-energy-density-reducing structure. The asymmetry may provide a difference between a first zero-point energy density on a first side of the electronic device and a second zero-point energy density on a second side of the electronic device, such that the difference drives a flow of energy across the device.

In embodiments, the electronic device exhibits a structure that permits transport or capture of charge carriers that pass through the electronic device in 1 ps or less. In some cases, the structure of the electronic device permits transport or capture of the charge carriers in 100 fs or less, 10 fs or less, 1 fs or less, or 0.1 fs or less. Components of the electronic device may, for example, be very thin, such as exhibiting thickness of 100 nm or less, in some cases, which can allow for fast transport of charge carriers. In some cases, at least a portion of the electronic device may comprise a component of the zero-point-energy-density-reducing structure.

In some devices of this aspect, the zero-point-energy-density-reducing structure comprises a Casimir cavity adjoining the electronic device. The electronic device may comprise a first conductive layer adjoining the Casimir cavity or comprising a component of the Casimir cavity; a transport layer disposed adjacent to and in contact with the first conductive layer; and a second conductive layer disposed adjacent to and in contact with the transport layer. In various examples, the first conductive layer comprises a metal, a semiconductor, a two-dimensional conductive material, a superconductor, or a conductive ceramic. Optionally, the second conductive layer comprises a metal, a semiconductor, a two-dimensional conductive material, a superconductor, or a conductive ceramic. Example transport layer include those comprising a dielectric or a semiconductor. The first conductive layer can optionally comprise a component of the electronic device as well as a component of the Casimir cavity.

An example Casimir cavity comprises a first reflective layer; a cavity layer; and a second reflective layer, with the cavity layer between the first reflective layer and the second reflective layer. Useful cavity layers include those comprising an evacuated or gas-filled gap layer or a condensed-phase optically transparent material layer, such as a solid, liquid, or liquid crystal. Optionally, the second reflective layer comprises one or more components of the electronic device, such as at least a portion of a conductive layer of the electronic device.

Various electronic devices are useful with devices of this aspect. For example, in some cases, the electronic device comprises a diode, such as, and without limit, a metal/insulator/metal diode (MIM), a Schottky diode, a metal/insulator/semiconductor (MIS) diode, a Mott diode, a quantum well diode, a ballistic diode, or a carbon nanotube diode. Optionally, the electronic device comprises a superconductor/insulator/superconductor (SIS) device. In one example, the electronic device comprises a conductive layer adjacent to the zero-point-energy-density-reducing structure or comprising a component of the zero-point-energy-density-reducing structure, and a semiconductor layer disposed adjacent to and in contact with the conductive layer. Optionally, the semiconductor layer may be doped.

In another aspect, device arrays are disclosed, such as for producing electrical power. An example device array of this aspect comprises a plurality of devices arranged in an array configuration. For example, at least a subset of the plurality of devices are optionally arranged in a series configuration. Optionally, at least a subset of the plurality of devices are arranged in a parallel configuration. In some examples, the plurality of devices are arranged in a combination of series and parallel configurations. Devices useful for the device arrays of this aspect include any of the devices described herein, such as the Casimir photoinjector devices described above and throughout this disclosure.

In another aspect, device stacks are disclosed, which may comprise a plurality of device layers arranged in a stacked configuration, such as where each device layer is positioned above and/or below at least one other device layer. Each device layer may comprise one or more devices described herein, such as the Casimir photoinjector devices described above and throughout this disclosure. In some cases, one or more or each of the device layers corresponds to an array comprising a plurality of the devices, such as the arrays described above and herein.

In another aspect, Casimir cavities are described. In some examples, a Casimir cavity may correspond to a filled Casimir cavity, such as a Casimir cavity comprising a first reflective layer, a cavity layer, and a second reflective layer, where the cavity layer is between the first reflective layer and the second reflective layer, and where the cavity layer comprises a condensed-phase material, such as a solid, a liquid, or a liquid crystal. Although these Casimir cavities may be referred to as a filled Casimir cavity, other Casimir cavities are described herein and useful with various aspects described herein, such as other Casimir cavities having an evacuated or gas-filled cavity layer.

Various configurations are disclosed for the Casimir cavities disclosed herein. For example, the cavity layer may optionally have a thickness of from 10 nm to 2 µm. In some examples, cavity layer comprises a material having a transmittance of greater than 20% for at least some wavelengths of light from 100 nm to 10 µm. Optionally, the first reflective layer and the second reflective layer of a Casimir cavity may each independently have thicknesses of at least 10 nm, such as from 10 nm to 1 cm. Optionally, a reflectivity of at least one of the first reflective layer or the second reflective layer of a Casimir cavity is from 50% nm to 100%. Example reflective layers useful with the Casimir cavities disclosed herein include, but are not limited to a metal, a dielectric reflector, a diffractive reflector, or an interface between the cavity layer and an adjacent material providing a step in index of refraction.

Without wishing to be bound by any particular theory, there can be discussion herein of beliefs or understandings of underlying principles relating to the invention. It is recognized that regardless of the ultimate correctness of any mechanistic explanation or hypothesis, an embodiment of the invention can nonetheless be operative and useful.

DETAILED DESCRIPTION

Quantum vacuum fluctuations fill all space with electromagnetic radiation. The energy density of this radiation in free space is $$\rho(hf) = \frac{8\pi f^2}{c^3}\left(\frac{hf}{\exp(hf/kT)-1} + \frac{hf}{2}\right) \qquad \text{Eq. 1}$$

where h is Planck's constant, f is the frequency of the radiation, c is the speed of light, k is Boltzmann's constant, and T is the temperature. The first term in brackets in Eq. 1 is due to thermal blackbody radiation at non-zero temperatures, and the second term is temperature independent and corresponds to the quantum vacuum radiation.

Figure 1:
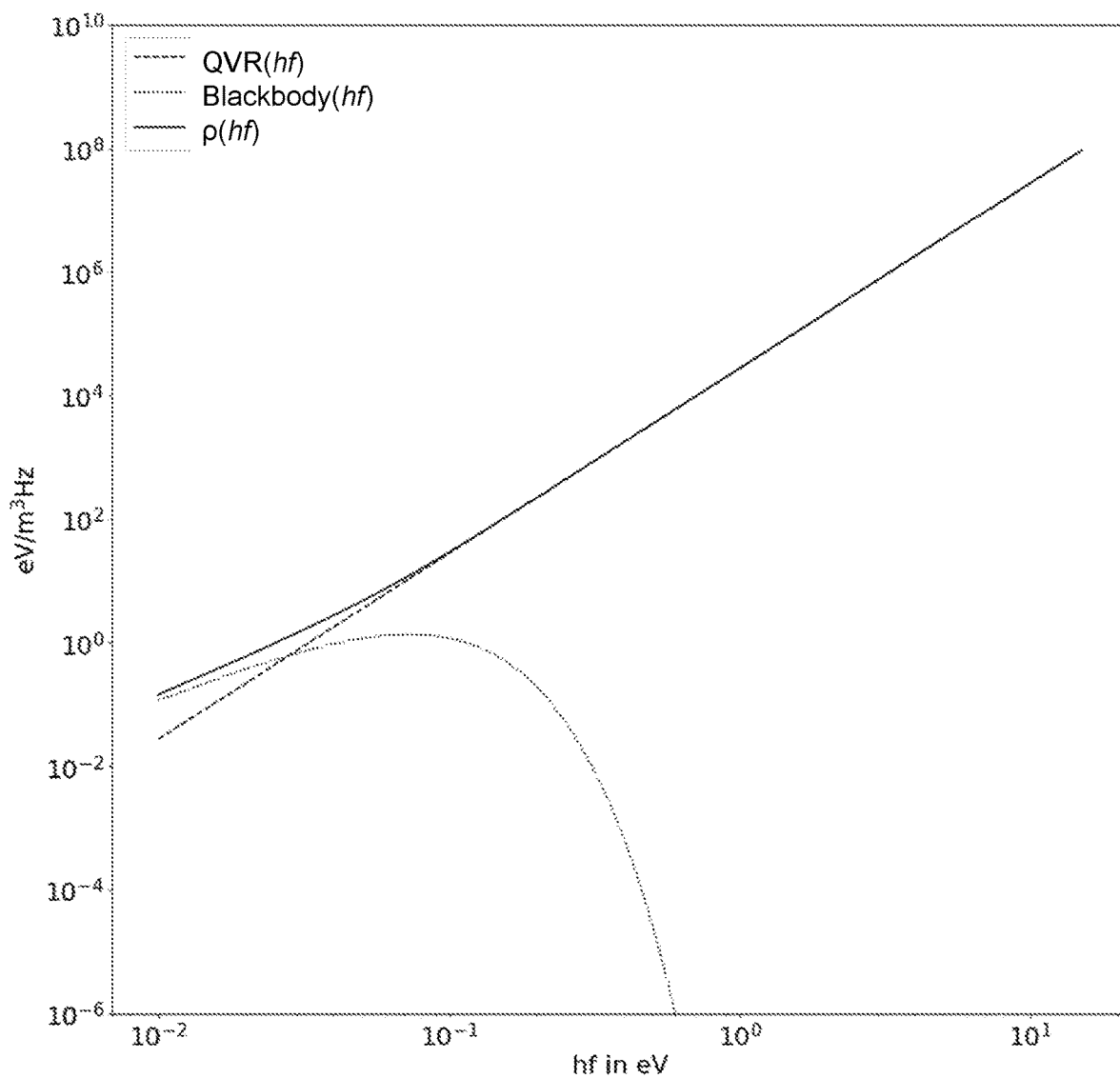
FIG. 1 provides a plot showing energy density spectra for quantum vacuum radiation and blackbody radiation.

The energy density ($\rho(hf)$) spectrum for both the temperature dependent term and the temperature independent term in Eq. 1 is shown in FIG. 1, where the data is plotted as a function of photon energy, hf, where h is Planck's constant and f is optical frequency, which varies with the reciprocal of the wavelength. At 300 K, the thermal component (labeled Blackbody(hf) in FIG. 1) reaches its maximum in the infrared through visible parts of the spectrum, whereas the quantum vacuum radiation (labeled QVR(hf) in FIG. 1) component grows with the frequency cubed and becomes much larger than the thermal component of the spectrum at visible light frequencies and beyond (as shown in Eq. 1, above, and Eq. 2, below). For 300 K blackbody radiation, the quantum vacuum radiation component exceeds the thermal part for any frequencies above 7 THz, corresponding to a photon energy of approximately 29 meV. Because the energy density of the quantum vacuum radiation part of the spectrum at high frequencies is much larger than that of the thermal spectrum, much more power may be available from the quantum vacuum radiation.

Harvesting energy arising out of the quantum vacuum radiation does not appear to violate any physical laws, but because the energy corresponds to that of the ground-state, there is generally no driver for the energy to flow. However, the quantum vacuum radiation is geometry dependent, and its density can be different in different regions of space. For example, a zero-point-energy-density-reducing structure can establish a geometric condition where the quantum vacuum radiation density in one region of space can be lower than in free space, such as outside the structure, which, therefore, provides a condition for energy flow to occur. One approach is described in U.S. Pat. No. 7,379,286, which is hereby incorporated by reference.

One example of a zero-point-energy-density-reducing structure is a Casimir cavity, which can be formed using two closely-spaced, parallel reflecting plates. As a result of the requirement that the tangential electric field must vanish (for an ideal reflector) at the boundaries, limits are placed on which quantum vacuum modes (i.e., field patterns) are allowed between the plates. In general, the modes allowed include those where the gap spacing is equal to an integer multiple of half of the wavelength. Modes having wavelengths longer than twice the gap spacing are largely excluded. This results in the full spectrum of quantum vacuum modes exterior to the plates, described by Eq. 1, being larger and more numerous than the constrained set of modes in the interior, and thus there is a lower energy density in the interior. The critical dimension, which determines the wavelength above which quantum vacuum modes are suppressed, is the gap spacing (for the case of a one dimensional Casimir cavity). Casimir cavities can also be constructed in the form of cylinders (nanopores), in which case the critical dimension is the diameter. Casimir cavities may be formed having other geometries as well, which can be used with the disclosed devices. Aspects described herein make use of the fact that the quantum vacuum energy level is dependent upon the local geometry, specifically the presence of a zero-point-energy-density-reducing structure, like a Casimir cavity.

Figure 2:
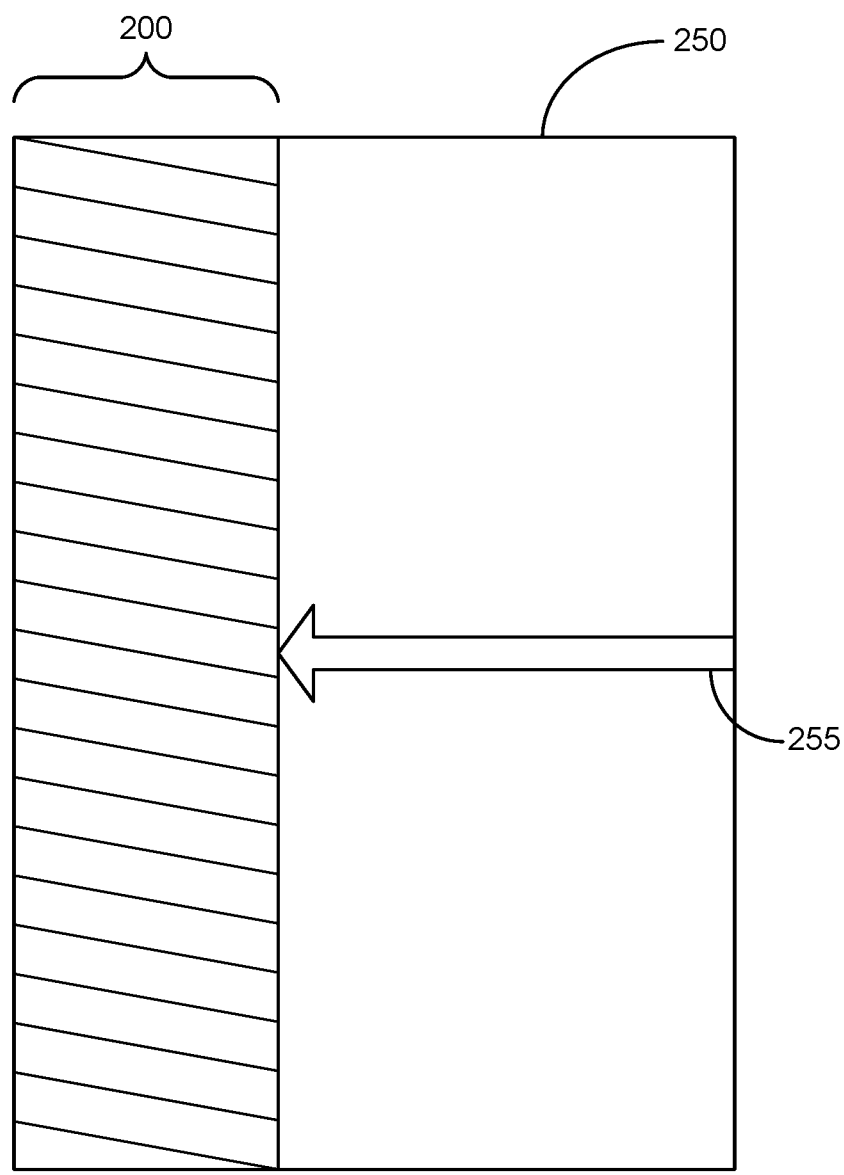
FIG. 2 provides a schematic illustration of an example device driven by an energy density difference, in accordance with at least some embodiments.

Zero-point energy is the ground state energy of a system that remains even at zero temperature. Quantum vacuum fluctuations include zero-point energy fluctuations in the form of electromagnetic radiation. Internal zero-point energy fluctuations also exist in materials that do not support electromagnetic radiation, for example in the form of plasmons. To be able to make use of a difference in zero-point energy densities, an asymmetry with respect to a zero-point-energy-density-reducing structure may be used, allowing a portion of the energy to be harvested. As shown in FIG. 2, a zero-point-energy-density-reducing structure 200 can be used to establish an asymmetry in zero-point energy densities between one side of a transport medium 250 and the other, such as by having one side of the transport medium 250 face the zero-point-energy-density-reducing structure 200, for example. By using a structure for producing an asymmetry in the zero-point energy density on one side of the device with respect to the other, and a structure for transport (e.g., the transport medium 250) of the excited charge away from the excitation location, a net power across the transport medium from the side that has no zero-point-energy-density-reducing structure, and hence has a higher zero-point energy level, to the side with the zero-point-energy-density-reducing structure, which has a lower zero point energy density, can flow across the transport medium 250, as schematically shown by arrow 255. The same concept applies if both sides have zero-point-energy-density-reducing structures, but having different critical dimensions or frequency cutoffs.

Another way to characterize an asymmetry requirement is in terms of equilibrium and detailed balance. In equilibrium, the flow of energy from any first element to any second element must be balanced by an equal energy flow from the second element to the first element. This results from a detailed balance. A zero-point-energy-density-reducing structure can facilitate a means to break this balance, so that there is a smaller flow of energy from the side of a device with the zero-point-energy-density-reducing structure than from the side of a device without it.

Casimir Cavities.

Figure 3:
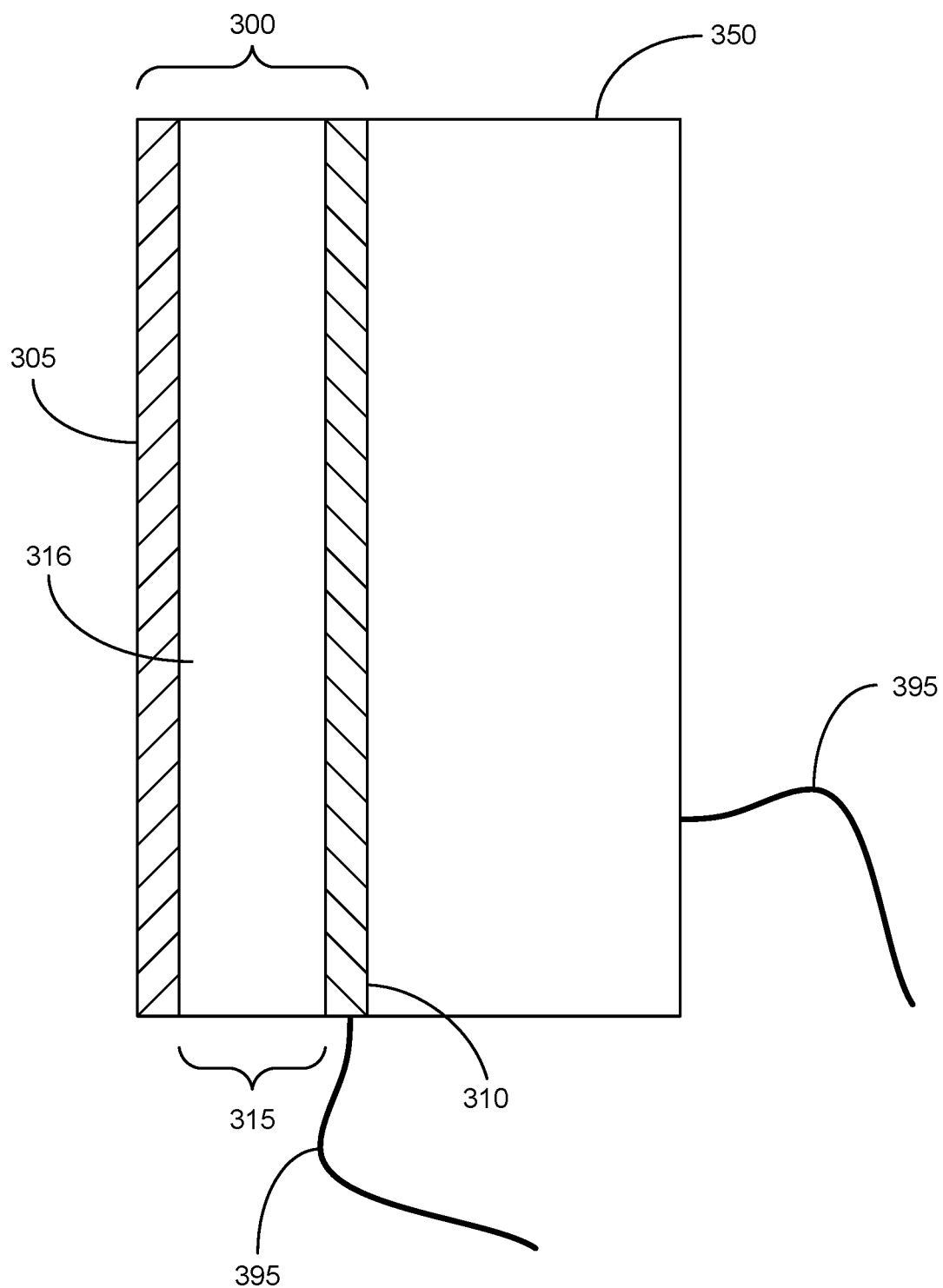
FIG. 3 provides a cross-sectional illustration of an example Casimir cavity adjacent to an example electronic device, in accordance with at least some embodiments.

FIG. 3 provides a schematic illustration of an example of a Casimir cavity 300 adjacent to a transport medium 350, which may comprise or correspond to an electronic device. Casimir cavity 300 comprises a first reflector 305, a second reflector 310, and a gap 315 between the first reflector 305 and the second reflector 310. Gap 315 (also referred to herein as a cavity layer) may be an empty gap (e.g., evacuated or corresponding to a vacuum) or filled with a gas, which may be achieved with rigid substrates and spacers. In some embodiments, gap 315 may be filled with a material 316, such an at least partially transparent optical material for at least some wavelengths of electromagnetic radiation supported by the Casimir cavity, preferably the entire visible range through the near ultraviolet. In contrast with a gas, material 316 may comprise a condensed-phase material, such as a solid, liquid, or liquid crystal. Example materials useful as a cavity layer include, but are not limited to, silicon oxide or aluminum oxide. Alternatively, it may be sufficient or desirable to fill the gap with a polymer such as PMMA (polymethyl methacrylate), polyimide, polymethyl methacrylate, or silicone, which can provide adequate transparency at wavelengths of interest. In some examples, the material of a cavity layer, such as those materials described above, may have a transmittance of greater than 20% for at least some wavelengths of electromagnetic radiation from 100 nm to 10 µm. Advantageously, the material of a cavity layer may have a transmittance of greater than 50% for at least some wavelengths of electromagnetic radiation from 100 nm to 10 µm. In some cases, the material of the cavity layer, including at least some of the materials described above, may have a transmittance of greater than 70% or greater than 90% for at least some wavelengths of electromagnetic radiation from 100 nm to 10 µm. The thickness or spacing of gap 315 can be set by the target wavelength range for the Casimir cavity. In some examples, the gap 315 of a Casimir cavity can have a spacing of from 10 nm to 2 µm.

The reflector material for first reflector 305 and/or second reflector 310 can be chosen based upon its reflectivity over the wavelength range of interest, ease of deposition, and/or other considerations, such as cost. The reflector thickness must be sufficient to provide adequate reflectivity, but not so thick as to be difficult to pattern. In some examples, a reflector can have a thickness of at least 10 nm, such as from 10 nm to 1 cm. Example materials useful as a reflector of a Casimir cavity include, but are not limited to, metals, dielectric reflectors, or diffractive reflectors, such as Bragg reflectors or metamaterial reflectors. Example metals useful for a reflector of a Casimir cavity include, but are not limited to, Al, Ag, Au, Cu, Pd, or Pt. Example dielectrics useful for a dielectric reflector include, but are not limited to $ZrO_2$, $SiO_2$, $Si_3N_4$, $Nb_2O_5$, $TiO_2$, $MgF_2$, LiF, $Na_3AlF_6$, $Ta_2O_5$, $LaTiO_3$, $HfO_2$, ZnS, ZnSe, or the like. Example reflectivity for at least one of the two reflectors of a Casimir cavity is from 50% to 100% for at least some wavelengths of electromagnetic radiation from 100 nm to 10 µm. The reflectors of a Casimir cavity do not have to be metals or dielectric reflectors, and instead a reflective interface may be used. For example, the reflective layer can be a step in the index of refraction at an interface between two adjacent materials, such as between the cavity layer and its surrounding material. In some cases the cavity walls can provide a step in dielectric constant or index of refraction on transitioning from one dielectric material to another one or more, or between a dielectric material and free space.

Alternatively, a Casimir cavity may be formed from a distributed Bragg reflector type multilayer dielectric stack. For example such a stack can comprise alternating layers of two or more dielectric materials having different indices of refraction. For the case of two types of materials, the thickness of each pair of layers characterizes the pitch. Wavelengths of twice the pitch are reflected, and longer wavelengths are largely suppressed. It is to be noted that this differs from antireflection coatings, in which the pitch is one quarter of a wavelength rather than one half of a wavelength, which is the case here. The layer thicknesses may further be chirped to enhance the spectral width of the reflections. Any suitable number of alternating dielectric layers of can be used, such as from 2 layers to 100 layers, or more. For example, to suppress a wavelength of 250 nm with a stack with alternating layers of $SiO_2$ and $Al_2O_3$, the layer thickness would be 42 nm and 35 nm, respectively. For a total of ten pairs of layers the overall thickness would be 770 nm.

In FIG. 3, a transport medium 350 is positioned adjacent to the Casimir cavity 300 such that one side of the transport medium 350 faces the Casimir cavity 300, establishing an asymmetry. Transport medium 350 can comprise a material that permits transmission of charge carriers, which can be used in a process of harvesting energy via the difference in zero-point energy densities established by the presence of the Casimir cavity 300. Electrical leads 395 can be connected to the second reflector 310 and transport medium 350 to provide captured energy to an external load. It will be appreciated that, although aspects described herein may be explained by reference to electrons as charge carriers, other charge carriers may be substituted for electrons for various implementations and operations of the disclosed devices, systems, techniques, and methods. Example charge carriers include, but are not limited to electrons, holes, Cooper pairs, any charged species, or magnetic fluxes, such as used in the field of spintronics.

To harvest or capture energy in the form of charge carrier excitation, the charge carrier will need to be transported away from the point at which it is launched and captured. Transport and capture of the charge carrier may need to be performed on very fast (i.e., short) time scales. For example, the transport and/or capture may occur in a time interval of less than or about 1 ps, less than or about 100 fs, less than or about 10 fs, less than or about 1 fs, or less than or about 0.1 fs. In some cases, the longer the time is, the smaller the fraction of energy available will be captured. Description of the need for fast transport and capture of charge carriers is described in further detail below.

Casimir Photoinjector.

Photons impinging on the surface of a conductor can cause charge carriers, usually electrons, in the conductor to become photoexcited, producing hot carriers. If the conductor layer is sufficiently thin, then these hot carriers can traverse the conductor layer and enter the material on the other side of it. This process is called internal photoemission, and also photoinjection. When this thin conductor layer is adjacent to a thin insulator, herein called a transport medium or transport layer, which is adjacent to a second conductor layer, the hot carriers can traverse the transport layer and enter the second conductor. Although carriers may also be excited thermally, this is not treated in the present description because it generally produces no net current for the devices described.

Figure 4:
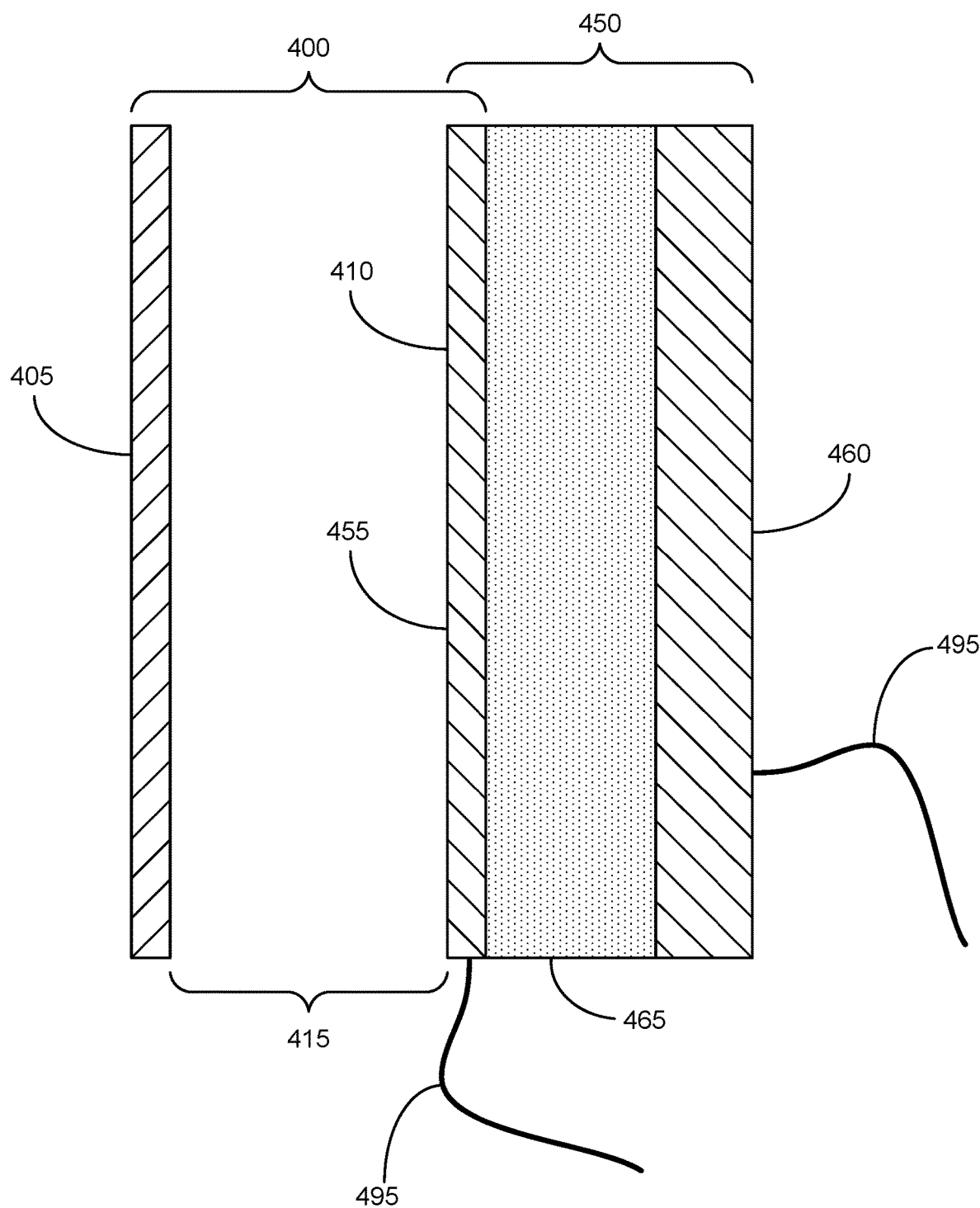
FIG. 4 provides a cross-sectional illustration of a first example Casimir photoinjector device, in accordance with at least some embodiments.

An example of a device that can make use of a difference in the flux of photoexcited charge carriers in two directions for harvesting energy is a Casimir photoinjector. A schematic cross-sectional illustration of an example Casimir photoinjector is provided in FIG. 4. The Casimir photoinjector in FIG. 4 comprises a Casimir cavity 400 disposed adjacent to or contiguous with an electronic device 450. Casimir cavity 400 comprises a first reflector 405, a second reflector 410, and a gap 415, which may optionally be filled with a material, as described above. Electronic device 450 comprises a first conductive layer 455, a second conductive layer 460, and a transport layer 465 between the first conductive layer 455 and the second conductive layer 460. In such a configuration, first conductive layer 455 can function, at least in part, as the second reflector 410 of Casimir cavity 400.

Example materials for the first conductive layer 455 and/or the second conductive layer 460, include, but are not limited to metals, semiconductors (e.g., low band-gap semiconductors), two-dimensional conductive materials, and conductive ceramics. Example metals include, but are not limited to, Ag, Pd, Pt, Au, Cu, Al, Ti, Cr, Nb, Ta, or the like. Graphene is one example of a two-dimensional semiconductor. Other useful materials for conductive layers include conductive ceramics and superconductors. Other useful materials for conductive layers include molybdenum disulfide and niobium nitride. Other useful electrically conductive materials include graphite, nickel silicide, or other silicides. In some cases, the first conductive layer 455 and/or the second conductive layer 460 can include a multilayer structure, such as a first layer of a first metal and a second layer of a second metal, which may be different from the first metal. An example of a bilayer structure may include a layer of chromium and a layer of aluminum. As described above, first conductive layer 455 and second conductive layer 460 may have different thicknesses. For example, first conductive layer 455, may have a thickness of from 3 nm to 100 nm, while second conductive layer 460, may have a thickness of from 5 nm to 5 cm.

Example materials for transport layer 465, include, but are not limited to, dielectrics or some semiconductors. Example dielectrics can include oxide dielectrics or nitride dielectrics, such as aluminum oxide, aluminum nitride, silicon oxide, silicon nitride, nickel oxide, titanium oxide, niobium oxide, and other insulating metal oxides or metal nitrides. In some cases, ceramic, glass, or plastic dielectrics may be used. An example of a semiconductor that may be used for transport layer 465 is hydrogenated amorphous silicon. In some cases, transport layer 465 can include a multilayer structure, such as a first layer of a first insulator and a second layer of a second insulator, which may be different from the first insulator. An example of a bilayer structure may include a layer of nickel oxide and a layer of aluminum oxide. Transport layer 465 may have a thickness different from thicknesses of the conductive layers. Example thicknesses for transport layer 465 may be from 0.3 nm to 50 nm.

In first conductive layer 455, there are at least two ways to excite the carriers into the hot carrier state. One is from photons impinging on the outer surface of the conductor, producing photoexcited carriers as described above. Ignoring thermally generated (blackbody) photons, a source of photons that can produce photoexcited carriers is the ambient quantum vacuum modes. Another non-thermal way to excite the carriers is from the internal zero-point energy fluctuations in the material of the first conductive layer 455. The combination of these two methods produces hot carriers that can enter the transport layer 465.

In the second conductive layer 460, a similar situation exists except that the second conductive layer 460 is too thick to allow photoexcited carriers produced on the outer surface of the conductor to penetrate the second conductive layer 460 and reach the transport layer 465. Instead the photoexcited carriers are scattered in the second conductive layer 460 and lose their excess energy, such as in the form of phonons and plasmons. Therefore, in the second conductive layer 460, the only non-thermal excitation source for hot carriers is from the internal zero-point energy fluctuations in the material of the second conductive layer 460. Because the second conductive layer 460 is thicker than the first conductive layer 455, the overall internal generation rate of excited carriers that are available to traverse the transport layer 465 is greater than that in the thinner first conductive layer 455.

Under equilibrium conditions, the carrier current from the second conductive layer 460 must be exactly the same as the carrier current produced in the first conductive layer 455 from the combination of internal and external energy sources. The current of carriers from the first conductive layer 455 to the second conductive layer 460 is precisely balanced by the current of carriers from the second conductive layer to the first conductive layer under equilibrium conditions.

On the other hand, with Casimir cavity 400 covering the first conductive layer 455, then the flux of photons impinging on the outer surface of the first conductive layer 455 is reduced. Hence, the generation rate of photoexcited carriers is reduced. This upsets the balance in the current of carriers between the two conductive layers, such that a there is a net current of carriers (e.g., electron current) from the second conductive layer 460 to the first conductive layer 455. Because the carriers are usually electrons, which carry a negative charge, the conventional positively-charged current flows from the first conductive layer 455 to the second conductive layer 460. In some cases, in contrast to the illustration in FIG. 4, another Casimir cavity may be positioned adjacent to second conductive layer, which can have a different critical dimension (i.e., gap) from that of Casimir cavity 400, to provide an imbalance in the current of carriers between the two conductive layers 455 and 460.

The Casimir photoinjector is a DC (direct current) device, in which differing average currents originating from first conductive layer 455 and second conductive layer 460 produce a voltage between first conductive layer 455 and second conductive layer 460. It may be connected directly to a load via electrical leads 495 connected to the first conductive layer 455 and second conductive layer 460.

Regarding the time interval for how quickly energy from the zero-point fluctuations must be extracted before it is returned to its source or is cancelled by an opposite-energy pulse, and becomes unavailable, this time interval may be governed by a tradeoff in the amount of energy that is available to be extracted from the vacuum, $\Delta E$, and time interval that is available for extraction, $\Delta t$. This results in a $\Delta E \Delta t \leq$ constant so that the larger the energy to be extracted, the shorter the time that it is available. If that constant is equal to $\hbar/2$, where $\hbar$ is Planck's constant divided by $2\pi$, then, based on this relationship, harvesting the energy of a photon of 2 eV ($\Delta E$), would indicate that $\Delta t \leq 0.16$ fs. Since hot electron transport across a thin insulating layer can occur in times that approach 1 fs, under this condition the transport process can be used to extract at least a fraction of the zero-point energy-excited charge carriers.

Schottky Diode-Based Casimir Photoinjectors.

Other structures that support charge transport from internal photoemission could be used as Casimir photoinjectors in place of the conductor/transport layer/conductor arrangement described above. These include Schottky diodes, and metal/insulator/semiconductor (MIS) diodes, Mott diodes, quantum well diodes, ballistic diodes, carbon nanotube diodes, superconductor/insulator/superconductor (SIS) devices, and other structures that facilitate the injection of charge as known to those skilled in the art. An example of another Casimir photoinjector device comprising a Schottky diode is schematically illustrated in FIG. 5, but it will be appreciated that the other structures described may be substituted for the Schottky diode.

Figure 5:
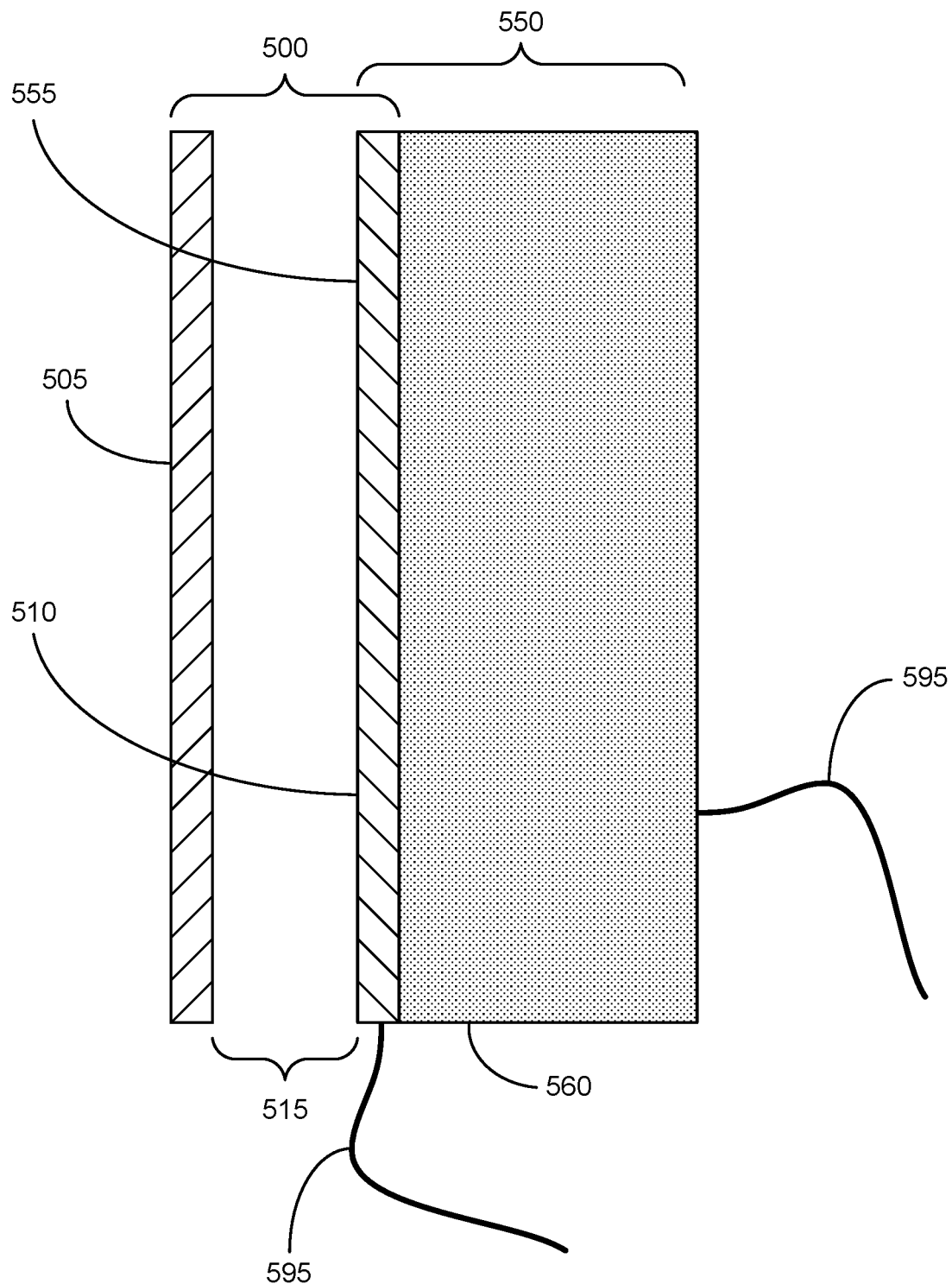
FIG. 5 provides a cross-sectional illustration of a second example Casimir photoinjector device, in accordance with at least some embodiments.

In FIG. 5, a Casimir cavity 500 is shown, comprising a first reflective layer 505 and a second reflective layer 510 separated by a gap 515. An electronic device 550 is shown, comprising a semiconductor 560 and a conductive layer 555, which corresponds, at least in part, to second reflective layer 510. Contact between conductive layer 555 and semiconductor 560 provides a junction with a band structure that is different from the band structure of the conductor/insulator/conductor structures described herein. Instead of being transported directly from a first conductive layer through a transport layer to a second conductive layer, in the Schottky diode-based Casimir photoinjector, the hot carriers are transported from conductive layer 555 through the accumulation layer or depletion layer and into the bulk of semiconductor 560, where the hot carriers can be captured. Electrical leads 595 can be connected to conductive layer 555 and semiconductor 560 to extract the net flow of electrons for use by an external load.

The transport distance, and hence transport time, for a Schottky-diode can be larger than for the case of the conductor/transport layer/conductor structures described herein. Because of the longer transport time, the fraction of hot carriers that are captured and collected can be diminished. A shorter accumulation or depletion width may result in a quicker capture time. To reduce the width of the accumulation or depletion layer, the semiconductor may be doped heavily, for example, such as with a dopant concentration of from $10^{15}$ cm$^{-3}$ to $10^{21}$ cm$^{-3}$, or a subrange thereof. In some cases, a thin semiconductor region between conductive layers, which is a variation on a Schottky barrier called a thin Mott barrier, can be used to reduce the transport distance. Both of these methods of reducing the transport distance can reduce the transport time and hence increase the fraction of hot carriers that are captured and collected.

Casimir Photoinjector Energy Harvesting.

The energy or power that can be captured using a Casimir photoinjector may depend upon the characteristics of the Casimir cavity and the materials and structure of the electronic device.

As noted above, the energy density from the quantum vacuum is provided by the temperature independent term in Eq. 1, which is $$\rho(hf) = \frac{8\pi f^2}{c^3}\left(\frac{hf}{2}\right) = \frac{4\pi h f^3}{c^3}. \qquad \text{Eq. 2}$$

The flux of photons (number of photons per unit area per unit frequency) is given by $$j = \rho(hf)\frac{c}{4hf} \qquad \text{Eq. 3}$$

where c is the arrival speed, hf is the photon energy, and ¼ is a geometrical factor for the radiation. The total flux (number of photons per unit area) is $$J = \int jdf = \frac{\pi}{c^2}\int_{f_1}^{f_2} f^2 df = \frac{3\pi}{h^3 c^2}[(hf_2)^3 - (hf_1)^3] \quad \text{Eq. 4}$$

where $hf_2$ is the highest photon energy that is suppressed by the Casimir cavity, and $hf_1$ is lowest photon energy that provides sufficient energy for the photoexcited electron to surmount the barrier and tunnel through the transport layer. This low-energy cutoff is an approximation (the cutoff is actually gradual), because the reduction with photon energy follows an Airy function, which describes allowed cavity modes. The current that results from this flux is approximately $$I = Je = 2.37 \times 10^{-4}[(hf_2)^3 - (hf_1)^3] A/\mu m^2 \quad \text{Eq. 5}$$

where e is the elementary charge.

For the case of a Casimir cavity providing a photon high energy cut off of 2.6 eV and an approximate low energy barrier cutoff of 1.6 eV, the resulting current is 3.2 mA/μm². The actual current may be much smaller because the photoinjection probability, dependent upon the photon absorptivity in the first conductive layer, is not unity and an actual Casimir cavity is imperfect. With a photoinjection probability of 0.05% and a Casimir cavity blocking efficiency of only 25%, the resulting current drops to 0.4 μA/μm². It will be appreciated that these numbers are provided for illustration purposes only and are not intended to be limiting. The actual output could be smaller or larger depending upon the Casimir photoinjector characteristics, geometries, materials, or the like.

In some cases, a photoinjection probability of 0.05% may be sufficient to achieve a useable power output. If the photoinjection probability is increased, however, even more power may be available. As described above, in equilibrium and in the absence of Casimir cavities, there is a balance of carrier currents between the two conductive layers. To maintain that balance, if there is an increase in the efficiency of photoexcited hot carriers in the first conductive layer traversing the transport layer then there must be a compensating reduction in the generation rate of internally generated hot carriers in the first conductive layer that can traverse the transport layer. Because the generation rate of photoexcited hot carriers is suppressed by the addition of a Casimir cavity, when the efficiency of photoexcited hot carriers in the first conductive layer traversing the transport layer is greater, then the carrier current that is suppressed by the addition of a Casimir cavity is greater. That suppression results in a greater imbalance between the current of carriers from the first conductive layer to the second conductive layer and the current of carriers from the second conductive layer to the first conductive layer, and hence a larger net current. Therefore, it may be advantageous to provide as efficient a process as possible for producing and/or injecting photoexcited hot carriers in the first conductive layer that can traverse the transport layer.

In some cases, structures to accomplish this can be integrated into the conductive layers of the electronic device, such as plasmonic nanostructures embedded into or on a surface of one or more of the conductive layers. Plasmonic nanostructures are a class of metamaterial in which nanoscale arrangements of materials, such as metals, can provide efficient coupling of electromagnetic radiation into the material and enhance hot carrier emission. Examples of plasmonic nanostructures for enhancing optical absorption are known in the art. See, e.g., Wang et al., 2011, "Plasmonic energy collection through hot carrier extraction," Nano Lett., 11:12, 5426-5430; Atar et al., 2013, "Plasmonically enhanced hot electron based photovoltaic device," Optics Express 21:6, 7196-7201; and Clavero, 2014, "Plasmon induced hot-electron generation at nanoparticle/metal-oxide interfaces for photovoltaic and photocatalytic devices," Nature Photonics, 8:2, 95-103; which are hereby incorporated by reference. Examples of plasmonic nanostructures providing enhanced hot carrier emission and injection, such as by factors of up to 25×, are known in the art. See, e.g., Knight et al., 2013, "Embedding plasmonic nanostructure diodes enhances hot electron emission," Nano Lett., 13:4, 1687-1692; Chalabi et al., 2014, "Hot-electron photodetection with a plasmonic nanostripe antenna," Nano Lett., 14:3, 1374-1380; and Brongersma, 2015, "Plasmon-induced hot carrier science and technology," Nature Nanotechnology, 10:1, 25-34, which are hereby incorporated by reference. Example plasmonic nanostructures useful with embodiments disclosed herein may include, but are not limited to, nanoparticles of a conductive material (e.g., metal) embedded into or on a surface of a conductive layer, such as over a non-conducting or insulating material on the surface of the conductive layer, and the patterning of the surface or interface of the conductive material. Examples of Casimir photoinjector devices incorporating plasmonic nanostructures are schematically illustrated in FIG. 6 and FIG. 7.

Figure 6:
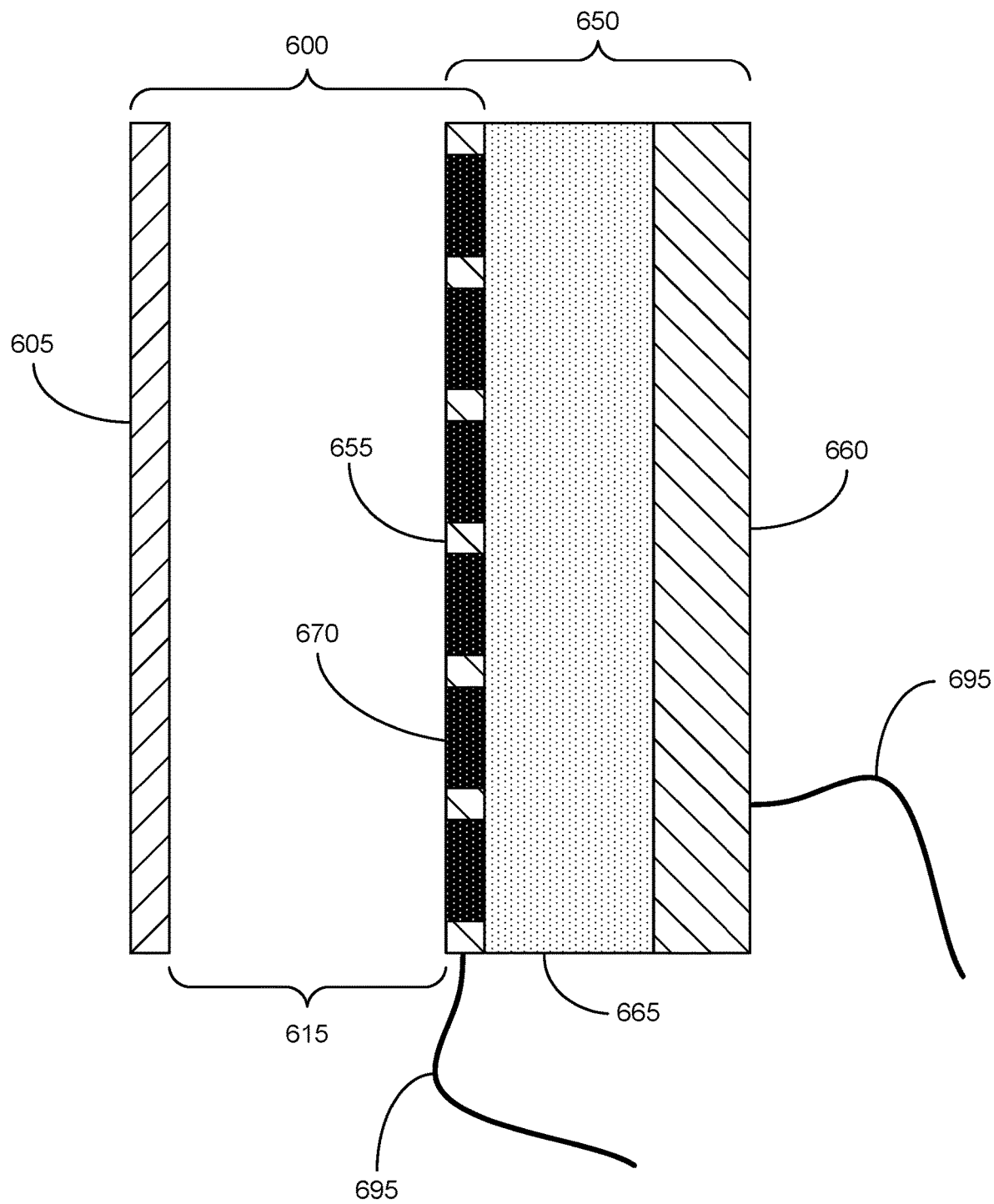
FIG. 6 provides a cross-sectional illustration of a third example Casimir photoinjector device, in accordance with at least some embodiments.

In FIG. 6, the Casimir photoinjector device includes a Casimir cavity 600, which comprises a first reflective layer 605 and a second reflective layer separated by a gap 615. An electronic device 650 is positioned adjacent to Casimir cavity 600, such that the second reflective layer of Casimir cavity 600 corresponds, at least in part, to the first conductive layer 655 of electronic device 650. Electronic device 650 further includes a second conductive layer 660 and a transport layer 665 between first conductive layer 655 and second conductive layer 660. Here, first conductive layer 655 includes plasmonic nanostructures, schematically represented by element 670, which can modify the optical absorption characteristics of the first conductive layer 655 or greatly improve the hot carrier injection efficiency into the transport layer 665, for example. Electrical leads 695 can be connected to first conductive layer 655 and second conductive layer 660 to extract the net flow of electrons for use by an external load.

Figure 7:
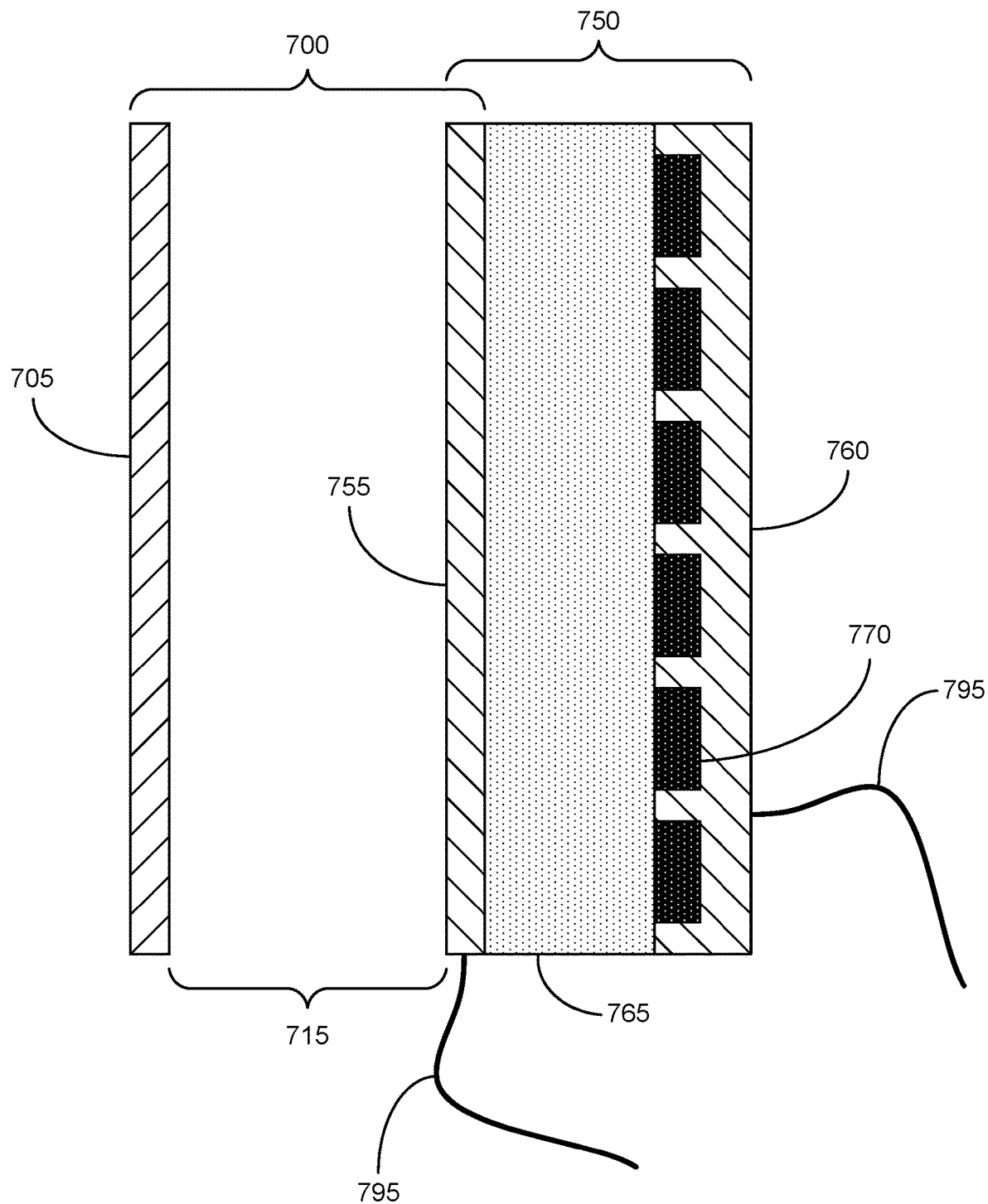
FIG. 7 provides a cross-sectional illustration of a fourth example Casimir photoinjector device, in accordance with at least some embodiments.

In FIG. 7, the Casimir photoinjector device includes a Casimir cavity 700, which comprises a first reflective layer 705 and a second reflective layer separated by a gap 715. An electronic device 750 is positioned adjacent to Casimir cavity 700, such that the second reflective layer of Casimir cavity 700 corresponds, at least in part, to the first conductive layer 755 of electronic device 750. Electronic device 750 further includes a second conductive layer 760 and a transport layer 765 between first conductive layer 755 and second conductive layer 760. Here, second conductive layer 760 includes plasmonic nanostructures, schematically represented by element 770, which can modify the optical absorption characteristics of second conductive layer 760 or greatly improve the hot carrier injection efficiency into the transport layer 765, for example. Electrical leads 795 can be connected to first conductive layer 755 and second conductive layer 760 to extract the net flow of electrons for use by an external load.

Figure 8:
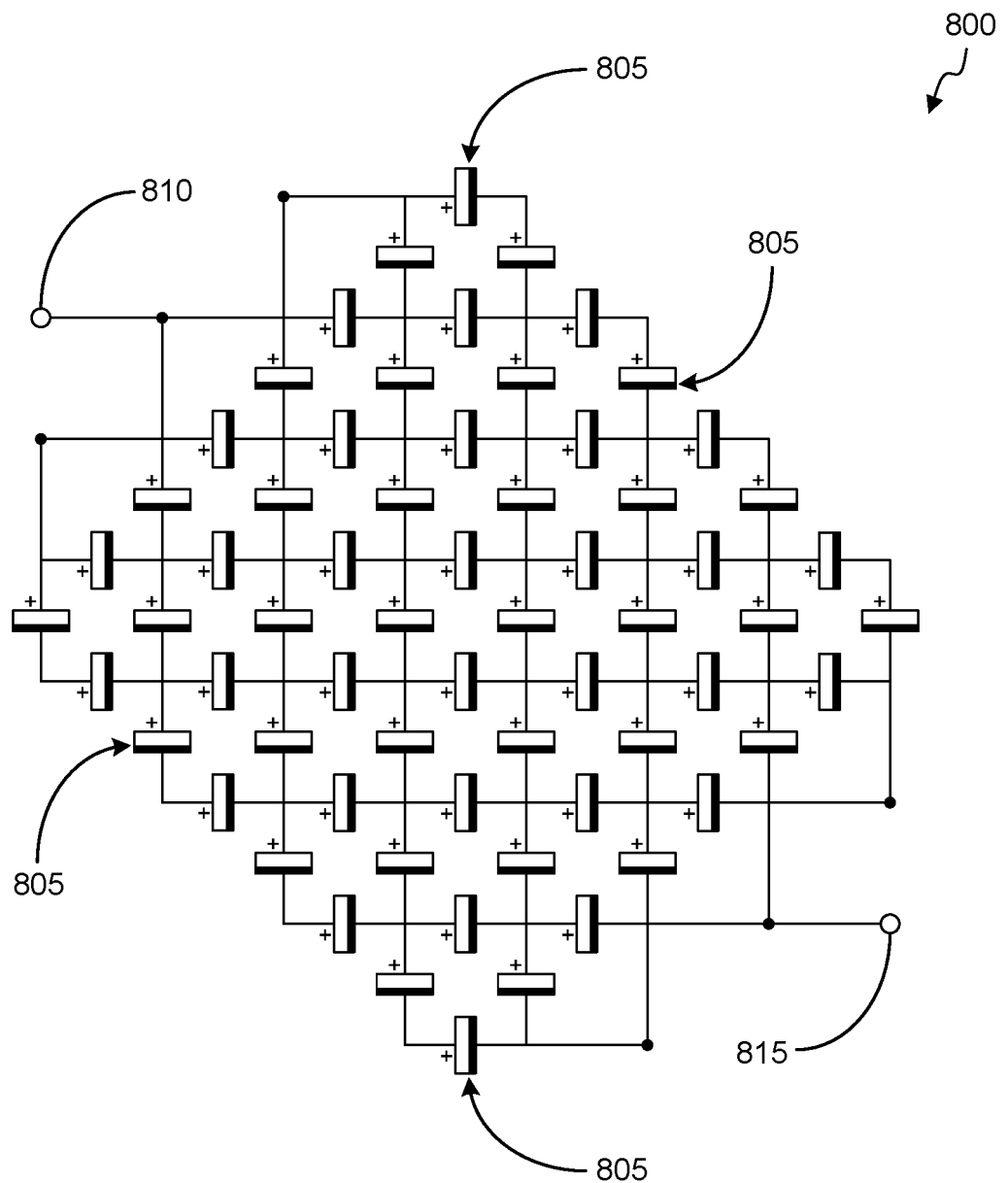
FIG. 8 provides a schematic circuit diagram of an example device array, in accordance with at least some embodiments.

Device arrays. To achieve large power output, multiple devices can be configured into an array, such that the power from each device is integrated to provide a higher total power output from the array. An example array 800 is schematically illustrated in FIG. 8. Array 800 is illustrated as an array of individual devices 805 connected in a series and parallel combination, with two output electrodes 810 and 815. Each device 805 in FIG. 8 represents any suitable device, such as that depicted in FIG. 3, comprising Casimir cavity 300 and transport medium 350, or other devices described herein. A load is not shown in FIG. 8 but may be connected between electrodes 810 and 815. The load can correspond to any suitable electrical device, such as, and without limit, a battery, a motor, a light-generating device, an electrolysis system to produce chemical fuel, a communication device, a computer, a circuit component, or any combination thereof.

In the 64-device array shown, the DC output voltage between electrodes 810 and 815 is the sum of voltages along a series path between the output electrodes. In this case, there are 8 devices 805 in series, and so if each device provides 0.25 V at its maximum power point, the total output voltage is 2 V, for example. The current is proportional to the number of devices 805 in parallel. In this case, there are 8 devices in parallel. For example, if each device 805 produces 400 nA at its maximum power point, the total output current is 3.2 µA. The total power output in this configuration is calculated (using P=IV) as 2 V×3.2 µA or 6.4 µW.

It will be appreciated that these values are provided merely as an example and are not intended to be limiting on the output voltage or current provided by any particular device array. Further, it will be appreciated that the 64-device array with 8 devices in series and 8 devices in parallel is also an example and that other array sizes and configurations can be used. For example, linear arrays, square arrays where the number of devices in series and in parallel is the same, rectangular arrays where the number of devices in series and in parallel is different, or non-regular arrays can be used.

Although linear arrays (i.e., 1-dimensional arrays of only series arranged devices 805 or only parallel arranged devices 805) are contemplated, advantages can be obtained by using devices 805 with a series and parallel combination. For example, in the event of a short circuit across any single device 805 in array 800, the voltage between electrodes 810 and 815 is only reduced by a small amount, rather than completely (i.e., to 0 V), as would be the case in an only parallel constructed array with a short circuit across any one device. Similarly, in the event of a disconnect or broken circuit path at any single device 805 in array 800, the current between electrodes 810 and 815 is only reduced by a small amount, rather than completely (i.e., to 0 A), as would be the case in an only series constructed array with a disconnect or broken circuit path.

Each device 805 in array 800 can have any suitable dimensions and physical arrangement. As an example, the devices can be arranged in a planar configuration across an area, such as similar to that depicted in FIG. 8. In one specific example, the devices 805 can have an area of 1 µm² each (e.g., 1 µm×1 µm) and be spaced from one another with a 2 µm pitch. The interconnects between the different devices and the leads for carrying DC power out may be sufficient for operation of such an array and additional complex supporting circuitry may not be needed. For an array having a pitch of 2 µm (4 µm² total area occupied by each device 805 and accompanying space between adjacent devices), a 10 cm×10 cm array can include 2.5 billion individual devices 805. For the voltages and currents per device described above (0.25 V and 400 nA), the output of the 10 cm×10 cm array can be up to 250 W.

Although 250 W from a 10 cm×10 cm panel is substantial (i.e., 25 kW/m²), the output power achievable by the Casimir photoinjector devices described herein can be much greater if the photoinjection probability can be increased. In some cases, thermal management techniques, such as known in the art, can be used to address heat transfer and temperature control, if needed. A photoinjection probability of 0.05% may be sufficient to achieve the 250 W number provided above. Use of plasmonic nanostructures or photonic metamaterials, such as described above with reference to FIG. 6 and FIG. 7, for example, can be useful for increasing the photoinjection probability. Increases by a factor of 25× or more are possible, in some cases, which can result in a photoinjection probability of up to 1.25%, for example.

The devices and arrays described above have been described with reference to planar configurations. To form compact systems with further areal density, multiple layers of these devices can optionally be stacked on top of each other and separated by insulators or free space. The devices can also be formed in a nonplanar configuration. For example, the devices can be formed on the surfaces of trenches formed in a substrate or on flexible substrates that can be rolled up.

Device Fabrication.

Figure 9A:
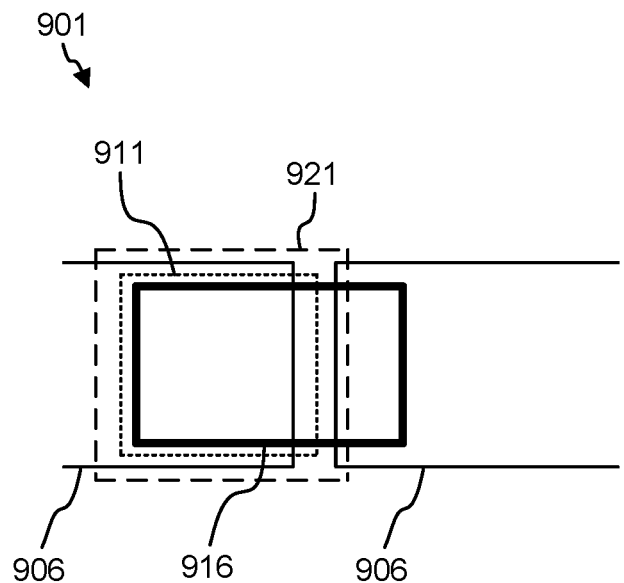
FIG. 9A provides a layout of patterns for fabricating an example Casimir photoinjector device, in accordance with at least some embodiments.
Figure 9B:
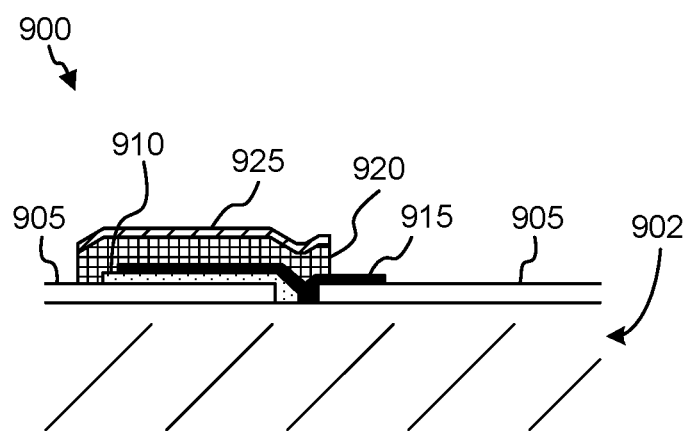
FIG. 9B provides a cross-sectional illustration of an example Casimir photoinjector device, in accordance with at least some embodiments.

An example fabrication process according to a pattern 901 shown in FIG. 9A for a Casimir photoinjector device 900 as schematically illustrated in cross-section in FIG. 9B is described below.

Casimir photoinjector device 900 is shown comprising a conductor/insulator/conductor device, which comprises a first metal layer 905, a transport layer 910, and a second metal layer 915, adjacent to a Casimir cavity, which comprises the second metal layer 915, a cavity layer 920, and a reflective layer 925. Pattern 901 includes a first metal layer pattern 906, a transport layer pattern 911, a second metal layer pattern 916, and Casimir cavity pattern 921.

In an example, a cell comprising a Casimir photoinjector 900 may have an active area of 25 µm×25 µm. The Casimir photoinjector device 900 can be electrically linked to those of adjacent cells to form an array comprising series and parallel combinations, as described above. For cells on a 40 µm pitch to allow sufficient area around the active area for interconnects, there can be a total of 56.25 million elements an array in overall substrate area of 30 cm×30 cm.

First Metal Layer.

First metal layer 905 forms the base layer for the Casimir photoinjector device 900, and provides the interconnects between adjacent devices. By way of example, the following steps can be used for preparation of the first metal layer 905:

1. Negative photoresist is spun onto the substrate 902 and soft baked.

2. Using an aligner, the first metal layer pattern 906 shown in FIG. 9A is exposed, followed by a post-exposure bake, develop and rinse.

3. 50 nm of nickel is evaporated onto the substrate and lifted off with acetone, followed by isopropanol and then a water rinse, to form the first metal layer 905 according to first metal layer pattern 906.

Transport Layer.

Hot electrons generated in the first metal layer 905 are injected through the transport layer 910. By way of example, the following steps can be used for preparation of the transport layer 910:

1. The material for transport layer 910 is initially deposited over the entire surface. It is composed of $Al_2O_3$, sputtered from an $Al_2O_3$ target in an argon plus oxygen atmosphere to a thickness of 3 nm.
2. Positive photoresist is spun onto the substrate and soft baked.
3. Using an aligner, the field for the transport layer pattern 911 is exposed, followed by a post-exposure bake, develop and rinse.
4. The exposed $Al_2O_3$ is etched with a $CF_4$—Ar plasma to form the transport layer 910.
5. The remaining photoresist is cleaned off with an oxygen plasma.

Second Metal Layer.

Second metal layer 915 forms the upper layer, absorbing photons from the Casimir cavity to produce hot electrons, and makes contact with the first metal layer 905 from adjacent devices. By way of example, the following steps can be used for preparation of the second metal layer 915:
1. 15 nm of palladium is evaporated onto the substrate to form second metal layer 915.
2. Positive photoresist is spun onto the substrate and soft baked.
3. Using an aligner, the field for the second metal layer pattern 916 is exposed, followed by a post-exposure bake, develop and rinse.
4. The exposed palladium is etched with a $CF_4$—Ar plasma to complete patterning of second metal layer 905.
5. The remaining photoresist is cleaned off with an oxygen plasma.

Cavity Transparent Layer and Mirror (Casimir Cavity).

As described above, the Casimir cavity restricts quantum vacuum energy modes on one side of the device. By way of example, the following steps can be used for preparation of the Casimir cavity:
1. 30 nm of $SiO_2$ is deposited by sputtering onto the substrate for use as a cavity layer 920, followed by 150 nm of aluminum for use as reflective layer 925.
2. Positive photoresist is spun onto the substrate and soft baked.
3. Using an aligner, the field for the Casimir cavity pattern 921 is exposed, followed by a post-exposure bake, develop and rinse.
4. The exposed aluminum and $SiO_2$ are etched with 6:1 buffered oxide etch (BOE), followed by a water rinse, to form the Casimir cavity pattern 921.
5. The remaining photoresist is cleaned off with an oxygen plasma.

It will be appreciated that the above description of a fabrication scheme for making Casimir photoinjector device 900 is merely exemplary and that a variety of different dimensions, processing schemes, materials, patterns, or the like may be used by the skilled artisan to prepare a Casimir photoinjector element.

Example Ranges of Dimensions.

Although a cell size of 25 μm×25 μm is described above, other cell sizes can be used. Example cell sizes may be from 0.1 μm on an edge up to 1 meter. In some examples, the chosen size can be determined by (i) the desired output characteristics, (ii) redundancy to compensate for defective cells, and (iii) the ease of fabrication.

Regarding the desired output characteristics, the following example is illustrative. For a cell (i.e., including a Casimir photoinjector device) that produces an open circuit voltage ($V_{OC}$) of 0.1 V and a current of 100 kA/m², a 1 cm×1 cm cell produces a short circuit current ($I_{SC}$) of 10 A. The cell resistance, $V_{OC}/I_{SC}$, is then 0.01 ohms. This resistance may be too low to be practical, because the resistance of the connection to the load or another cell is approximately the same or higher, with the result that more than half of the power produced by the cell can be dissipated in the connections. For that reason, and given the numbers in this illustration, a smaller cell can be desirable to make each cell have a higher resistance, with the result that the connection resistance is much lower than the cell resistance and only a small fraction of the power is dissipated in the connections.

Regarding redundancy, the following example is illustrative. For a particular fabrication process there may be one defect that causes the device to be shorted in an area of approximately 1 cm². If the cell area is 1 cm², then roughly 50% of the cells will be defective and useless. On the other hand, if the cell area is 0.01 cm², then roughly one cell out of 100 will be defective. Using an array design that accommodates defects, such as the one provided in FIG. 9, then only approximately 2% of the power may be lost.

Regarding ease of fabrication, smaller cells may require more expensive or complex fabrication. For example, large area devices having feature sizes of at least 1 mm can be patterned by inexpensive screen printing, whereas submicron features may require very expensive deep-UV lithography. There are exceptions, however. For example, nano-imprint lithography can produce some types of submicron features inexpensively, and roll-to-roll manufacturing can produce small features cheaply over large areas. Still, usually larger features can be easier to manufacture.

All of these factors can affect the choice of cell size. For the example, a cell size of 25×25 μm and the current density of 100 kA/m² and $V_{OC}$ of 0.1 V given above can give a resistance of 1.6 kΩ, which can be a useful resistance to work with. The cell size is sufficiently small that the probability of having defects in a given cell can be small, and the need for redundancy can be small. Although these dimensions may require lithography, they are sufficiently course that inexpensive methods can be used to achieve them.

The first conductive layer may be sufficiently thick to provide low sheet resistance (e.g., greater than 10 nm), but thin enough that it does not create too large a step for the second conductive layer to cover (e.g., less than 10 μm). In some examples, more sophisticated patterning to provide smooth transitions can mitigate this requirement.

The transport layer may be sufficiently thin to allow a large injected electron current, but thick enough to provide high enough resistance a support a sufficiently large voltage. The following is an example to illustrate the tradeoffs involved.

For a cell area of 25 μm×25 μm, a transport layer of a particular material having a thickness of 2 nm can give a cell resistance of 10 ohms. For a current of 200 kA/m², that can produce a cell short circuit current of 125 μA and hence an open circuit voltage of 1.25 mV. That voltage is far smaller than the target voltage of 0.1 V because of the small resistance due to the thin transport layer. The power produced by the cell is equal to (short circuit current)×(open circuit voltage)×(fill factor) which, using a fill factor of ¼ for these devices, may be about 39 nanowatts.

The current and the resistance can vary roughly exponentially with the thickness, and so a small change in transport layer thickness can make a large difference in both of those quantities. Continuing the illustrative example, if a 3 nm thick transport layer provides a cell resistance of 1000 ohms and a current of 100 kA/m², then the cell short circuit current is 62.5 microamps and the voltage produced is 0.0625 V, which is close to the targeted voltage. The power produced by the cell is equal to (short circuit current)×(open circuit voltage)×¼=0.97 microwatt, a factor of 25 greater than for the 10 ohm case. For this reason, a thicker transport layer can be advantageous.

On the other hand, when the transport layer becomes too thick, the current can be drastically reduced due to a much smaller probability of electrons being injected through the material. For example, if a 5 nm thick transport layer provides a cell resistance of 100 kΩ and a current of 1 kA/m$^2$, then the cell short current is 0.625 microamps and the voltage produced is 0.0625 V, which is close to the targeted voltage. The power produced by the cell is short circuit current×open circuit voltage×¼=9.8 nanowatts. The power is much lower than for the 3 nm thick transport layer, and therefore 5 nm may be too thick in this illustrative example.

A compounding factor is that there may be a native oxide that has grown on the first conductive layer and adds to the overall transport layer thickness. This can be taken into account when choosing the thickness to deposit. The desired transport layer thickness can also depend upon the barrier height that the particular materials combination produces. A higher barrier increases the resistance and reduces the injection current. In some examples, the thickness of the transport layer can fall between 0.5 nm and 20 nm.

The thickness of second conductive layer can be important for producing high currents. There is a tradeoff between films that are too thin to absorb light and too thick to provide injected electrons. If the second conductive layer is too thin, it can absorb too little of the incoming photon flux from the Casimir cavity. In the case of the second conductive layer being extremely thin, its sheet conductance will be too small and will limit the available current. If the second conductive layer is too thick, then hot electrons generated at the Casimir cavity interface may not be able to reach the transport layer before being scattered. For example, the ballistic mean-free path length in gold is 38 nm, and it is lower in palladium. In some examples, the second conductive layer thickness can fall in the range of 5 nm to 50 nm. For metals patterned to make use of plasmonic effects described elsewhere in the specification, the metals can be thicker, and for other thin film materials, such as graphene and molybdenum disulfide, the materials can be as thin as a single monolayer.

Another function of the second conductive layer is to provide adequate sheet conductance to carry the current to the adjacent first conductive layer. This conductance can be supplemented with a metal grid that is formed on top of or below the second conductive layer, as may be included in the metallization in solar cells. For lines having the appropriate pitch and dimensions, this grid can also provide a plasmonic enhancement in absorption described elsewhere in this application. The grid lines can be generalized to form metamaterials to enhance both the photon absorption and the hot electron emission.

Illustrative Aspects

As used below, any reference to a series of aspects (e.g., "Aspects 1-4") or non-enumerated group of aspects (e.g., "any previous or subsequent aspect") is to be understood as a reference to each of those aspects disjunctively (e.g., "Aspects 1-4" is to be understood as "Aspects 1, 2, 3, or 4").

Aspect 1 is a device comprising: an electronic device; and a zero-point-energy-density-reducing structure adjoining the electronic device, the zero-point-energy-density-reducing structure providing an asymmetry with respect to the electronic device that drives a flow of energy or particles or waves across the electronic device, even in the absence of external sources of illumination.

Aspect 2 is the device of any previous or subsequent aspect, wherein at least a portion of the electronic device comprises a component of the zero-point-energy-density-reducing structure.

Aspect 3 is the device of any previous or subsequent aspect, wherein the asymmetry produces a voltage difference between a first side of the electronic device and a second side of the electronic device or wherein the asymmetry produces a net charge flow between a first side of the electronic device and a second side of the electronic device.

Aspect 4 is the device of any previous or subsequent aspect, wherein the asymmetry provides a reduction in a zero-point energy density on a first side of the electronic device as compared to the zero-point energy density on the first side of the electronic device in an absence of the zero-point-energy-density-reducing structure.

Aspect 5 is the device of any previous or subsequent aspect, wherein the asymmetry provides a difference between a first zero-point energy density on a first side of the electronic device and a second zero-point energy density on a second side of the electronic device that drives the flow of energy.

Aspect 6 is the device of any previous or subsequent aspect, wherein a first side of the electronic device corresponds to at least a part of a first conductive layer of the electronic device, and wherein a second side of the electronic device corresponds to at least a part of a second conductive layer of the electronic device.

Aspect 7 is the device of any previous or subsequent aspect, wherein the electronic device exhibits a structure that permits transport or capture of charge carriers that pass through the electronic device in 1 ps or less, 100 fs or less, 10 fs or less, 1 fs or less, or 0.1 fs or less.

Aspect 8 is the device of any previous or subsequent aspect, wherein the zero-point-energy-density-reducing structure comprises a Casimir cavity disposed adjoining, adjacent to or contiguous with the electronic device.

Aspect 9 is the device of any previous or subsequent aspect, comprising or corresponding to a Casimir photoinjector.

Aspect 10 is the device of any previous or subsequent aspect, wherein the electronic device comprises: a first conductive layer adjoining the Casimir cavity or comprising a component of the Casimir cavity; a transport layer disposed adjacent to and in contact with the first conductive layer; and a second conductive layer disposed adjacent to and in contact with the transport layer.

Aspect 11 is the device of any previous or subsequent aspect, wherein the first conductive layer comprises a metal, a semiconductor, a two-dimensional conductive material, or a conductive ceramic and wherein the second conductive layer comprises a metal, a semiconductor, a two-dimensional conductive material, or a conductive ceramic.

Aspect 12 is the device of any previous or subsequent aspect, wherein the transport layer comprises a dielectric or a semiconductor.

Aspect 13 is the device of any previous or subsequent aspect, wherein a barrier height magnitude between the transport layer and one or both of the first conductive layer or the second conductive layer is from 0 eV to 10 eV.

Aspect 14 is the device of any previous or subsequent aspect, wherein the first conductive layer has a thickness of from 3 nm to 100 nm.

Aspect 15 is the device of any previous or subsequent aspect, wherein the transport layer has a thickness of from 0.3 nm to 50 nm.

Aspect 16 is the device of any previous or subsequent aspect, wherein the second conductive layer has a thickness of at least 5 nm or from 5 nm to 1 cm.

Aspect 17 is the device of any previous or subsequent aspect, wherein at least one of the first conductive layer or the second conductive layer comprises a multilayer structure including one or more conductive sub-layers.

Aspect 18 is the device of any previous or subsequent aspect, wherein the first conductive layer includes a photonic metamaterial or a plasmonic nanostructure that increases an optical absorption character of the first conductive layer or enhances hot carrier emission, optionally towards the second conductive layer.

Aspect 19 is the device of any previous or subsequent aspect, wherein the second conductive layer includes a photonic metamaterial or a plasmonic nanostructure.

Aspect 20 is the device of any previous or subsequent aspect, wherein the first conductive layer includes a metamaterial that enhances an optical absorption character of the first conductive layer.

Aspect 21 is the device of any previous or subsequent aspect, wherein the first conductive layer includes a metamaterial that enhances hot carrier emission, optionally towards the second conductive layer.

Aspect 22 is the device of any previous or subsequent aspect, wherein the Casimir cavity comprises: a first reflective layer; a cavity layer; and a second reflective layer, wherein the cavity layer is between the first reflective layer and the second reflective layer.

Aspect 23 is the device of any previous or subsequent aspect, wherein the cavity layer has a thickness of from 10 nm to 2 µm.

Aspect 24 is the device of any previous or subsequent aspect, wherein the cavity layer comprises an evacuated or gas-filled gap layer or a condensed-phase optically transparent material layer.

Aspect 25 is the device of any previous or subsequent aspect, wherein the cavity layer comprises a condensed-phase optically transparent material layer.

Aspect 26 is the device of any previous or subsequent aspect, wherein the cavity layer comprises a material having a transmittance of greater than 20% for at least some wavelengths of electromagnetic radiation from 100 nm to 10 µm.

Aspect 27 is the device of any previous or subsequent aspect, wherein the first reflective layer and the second reflective layer each independently have thicknesses of at least 10 nm or from 10 nm to 1 cm; and/or wherein a reflectivity of at least one of the first reflective layer or the second reflective layer is greater than 50%, such as for at least some wavelengths of light from 100 nm to 10 µm.

Aspect 28 is the device of any previous or subsequent aspect, wherein the first reflective layer comprises a metal, a dielectric reflector, a diffractive reflector, or an interface between the cavity layer and an adjacent material providing a step in index of refraction.

Aspect 29 is the device of any previous or subsequent aspect, wherein the second reflective layer comprises one or more components of the electronic device.

Aspect 30 is the device of any previous or subsequent aspect, wherein the electronic device comprises a diode selected from a metal/insulator/metal diode (MIM), a Schottky diode, a metal/insulator/semiconductor (MIS) diode, a Mott diode, a quantum well diode, a ballistic diode, or a carbon nanotube diode, or wherein the electronic device comprises a superconductor/insulator/superconductor (SIS) device.

Aspect 31 is the device of any previous or subsequent aspect, wherein the electronic device comprises a conductive layer adjoining or adjacent to the zero-point-energy-density-reducing structure or comprising a component of the zero-point-energy-density-reducing structure, and a semiconductor layer disposed adjacent to and in contact with the conductive layer.

Aspect 32 is the device of any previous or subsequent aspect, wherein the semiconductor layer has a dopant concentration of from $10^{15}$ cm$^{-3}$ to $10^{21}$ cm$^{-3}$, from $10^{15}$ cm$^{-3}$ to $10^{16}$ cm$^{-3}$, from $10^{16}$ cm$^{-3}$ to $10^{17}$ cm$^{-3}$, from $10^{17}$ cm$^{-3}$ to $10^{18}$ cm$^{-3}$, from $10^{18}$ cm$^{-3}$ to $10^{19}$ cm$^{-3}$ from $10^{19}$ cm$^{-3}$ to $10^{20}$ cm$^{-3}$, or from $10^{20}$ cm$^{-3}$ to $10^{21}$ cm$^{-3}$.

Aspect 33 is the device of any previous or subsequent aspect, further comprising a load positioned to receive electric current from one or more electrically conductive layers of the electronic device.

Aspect 34 is the device of any previous or subsequent aspect, further comprising a substrate, wherein the zero-point-energy-density-reducing structure is disposed adjacent to and supported by the substrate.

Aspect 35 is the device of any previous or subsequent aspect, further comprising a substrate, wherein the electronic device is disposed adjacent to and supported by the substrate.

Aspect 36 is a device array comprising: a plurality of devices of any previous or subsequent aspect arranged in an array configuration.

Aspect 37 is the device array of any previous or subsequent aspect, wherein at least a subset of the plurality of devices are arranged in a series configuration.

Aspect 38 is the device array of any previous or subsequent aspect, wherein at least a subset of the plurality of devices are arranged in a parallel configuration.

Aspect 39 is the device array of any previous or subsequent aspect, wherein the plurality of devices are arranged in a combination of series and parallel configurations.

Aspect 40 is a device stack comprising: a plurality of device layers arranged in a stacked configuration, wherein each device layer comprises one or more devices of any previous or subsequent aspect.

Aspect 41 is the device stack of any previous or subsequent aspect, wherein each device layer is positioned above and/or below another device layer.

Aspect 42 is the device stack of any previous or subsequent aspect, wherein each device layer corresponds to an array comprising a plurality of the devices.

Aspect 43 is a device comprising: an electronic device; and a zero-point-energy-density-reducing structure disposed adjoining the electronic device, wherein the electronic device exhibits a structure that permits transport or capture of charge carriers that pass through the electronic device in 1 ps or less.

Aspect 44 is the device of any previous or subsequent aspect, wherein the structure permits transport or capture of the charge carriers in 100 fs or less, 10 fs or less, 1 fs or less, or 0.1 fs or less.

Aspect 45 is the device of any previous or subsequent aspect, wherein the zero-point-energy-density-reducing structure provides an asymmetry with respect to the electronic device that drives a flow of energy or particles or waves across the electronic device, even in the absence of external sources of illumination.

Aspect 46 is the device of any previous or subsequent aspect, wherein the asymmetry produces a voltage difference between a first side of the electronic device and a second side of the electronic device.

Aspect 47 is the device of any previous or subsequent aspect, wherein the asymmetry produces a net charge flow between a first side of the electronic device and a second side of the electronic device.

Aspect 48 is the device of any previous or subsequent aspect, wherein the asymmetry provides a reduction in a zero-point energy density on a first side of the electronic device as compared to the zero-point energy density on the first side of the electronic device in an absence of the zero-point-energy-density-reducing structure.

Aspect 49 is the device of any previous or subsequent aspect, wherein the asymmetry provides a difference between a first zero-point energy density on a first side of the electronic device and a second zero-point energy density on a second side of the electronic device that drives the flow of energy, even in the absence of external sources of illumination.

Aspect 50 is the device of any previous or subsequent aspect, wherein a first side of the electronic device corresponds to at least a part of a first conductive layer of the electronic device, and wherein a second side of the electronic device corresponds to at least a part of a second conductive layer of the electronic device.

Aspect 51 is the device of any previous or subsequent aspect, wherein the zero-point-energy-density-reducing structure comprises a Casimir cavity adjoining the electronic device.

Aspect 52 is the device of any previous or subsequent aspect, comprising or corresponding to a Casimir photoinjector.

Aspect 53 is the device of any previous or subsequent aspect, wherein the electronic device comprises: a first conductive layer adjoining the Casimir cavity or comprising a component of the Casimir cavity; a transport layer disposed adjacent to and in contact with the first conductive layer; and a second conductive layer disposed adjacent to and in contact with the transport layer.

Aspect 54 is the device of any previous or subsequent aspect, wherein the first conductive layer comprises a metal, a semiconductor, a two-dimensional conductive material, or a conductive ceramic and wherein the second conductive layer comprises a metal, a semiconductor, a two-dimensional conductive material, or a conductive ceramic.

Aspect 55 is the device of any previous or subsequent aspect, wherein the transport layer comprises a dielectric.

Aspect 56 is the device of any previous or subsequent aspect, wherein the transport layer comprises a semiconductor.

Aspect 57 is the device of any previous or subsequent aspect, wherein a barrier height magnitude between the transport layer and one or both of the first conductive layer or the second conductive layer is from 0 eV to 10 eV.

Aspect 58 is the device of any previous or subsequent aspect, wherein the first conductive layer has a thickness of from 3 nm to 100 nm.

Aspect 59 is the device of any previous or subsequent aspect, wherein the transport layer has a thickness of from 0.3 nm to 50 nm.

Aspect 60 is the device of any previous or subsequent aspect, wherein the second conductive layer has a thickness of from 5 nm to 1 cm.

Aspect 61 is the device of any previous or subsequent aspect, wherein at least one of the first conductive layer or the second conductive layer comprises a multilayer structure including one or more conductive sub-layers.

Aspect 62 is the device of any previous or subsequent aspect, wherein the first conductive layer includes a photonic metamaterial or a plasmonic nanostructure that increases an optical absorption character of the first conductive layer or that enhances hot carrier emission, optionally towards the second conductive layer.

Aspect 63 is the device of any previous or subsequent aspect, wherein the second conductive layer includes a photonic metamaterial or a plasmonic nanostructure.

Aspect 64 is the device of any previous or subsequent aspect, wherein the first conductive layer includes a metamaterial that enhances an optical absorption character of the first conductive layer.

Aspect 65 is the device of any previous or subsequent aspect, wherein the first conductive layer includes a metamaterial that enhances hot carrier emission, optionally towards the second conductive layer.

Aspect 66 is the device of any previous or subsequent aspect, wherein the Casimir cavity comprises: a first reflective layer; a cavity layer; and a second reflective layer, wherein the cavity layer is between the first reflective layer and the second reflective layer.

Aspect 67 is the device of any previous or subsequent aspect, wherein the cavity layer has a thickness of from 10 nm to 2 µm.

Aspect 68 is the device of any previous or subsequent aspect, wherein the cavity layer comprises an evacuated or gas-filled gap layer or an optically transparent material layer.

Aspect 69 is the device of any previous or subsequent aspect, wherein the cavity layer comprises a condensed-phase optically transparent material layer.

Aspect 70 is the device of any previous or subsequent aspect, wherein the cavity layer comprises a material having a transmittance of greater than 20% for at least some wavelengths of electromagnetic radiation from 100 nm to 10 µm.

Aspect 71 is the device of any previous or subsequent aspect, wherein the first reflective layer and the second reflective layer each independently have thicknesses of at least 10 nm or from 10 nm to 1 cm; and/or wherein a reflectivity of at least one of the first reflective layer or the second reflective layer is greater than 50%, such as for at least some wavelengths of light from 100 nm to 10 µm.

Aspect 72 is the device of any previous or subsequent aspect, wherein the first reflective layer comprises a metal, a dielectric reflector, a diffractive reflector, or an interface between the cavity layer and an adjacent material providing a step in index of refraction.

Aspect 73 is the device of any previous or subsequent aspect, wherein the second reflective layer comprises one or more components of the electronic device.

Aspect 74 is the device of any previous or subsequent aspect, wherein the electronic device comprises a diode selected from a metal/insulator/metal diode (MIM), a Schottky diode, a metal/insulator/semiconductor (MIS) diode, a Mott diode, a quantum well diode, a ballistic diode, or a carbon nanotube diode, or wherein the electronic device comprises a superconductor/insulator/superconductor (SIS) device.

Aspect 75 is the device of any previous or subsequent aspect, wherein the electronic device comprises a conductive layer adjoining or adjacent to the zero-point-energy-density-reducing structure or comprising a component of the zero-point-energy-density-reducing structure, and a semiconductor layer disposed adjacent to and in contact with the conductive layer.

Aspect 76 is the device of any previous or subsequent aspect, wherein the semiconductor layer has a dopant concentration of from $10^{15}$ cm$^{-3}$ to $10^{21}$ cm$^{-3}$, from $10^{15}$ cm$^{-3}$ to $10^{16}$ cm$^{-3}$, from $10^{16}$ cm$^{-3}$ to $10^{17}$ cm$^{-3}$, from $10^{17}$ cm$^{-3}$ to $10^{18}$ cm$^{-3}$, from $10^{18}$ cm$^{-3}$ to $10^{19}$ cm$^{-3}$ from $10^{19}$ cm$^{-3}$ to $10^{20}$ cm$^{-3}$, or from $10^{20}$ cm$^{-3}$ to $10^{21}$ cm$^{-3}$.

Aspect 77 is the device of any previous or subsequent aspect, further comprising a load positioned to receive electric current from one or more electrically conductive layers of the electronic device.

Aspect 78 is the device of any previous or subsequent aspect, further comprising a substrate, wherein the zero-point-energy-density-reducing structure is disposed adjacent to and supported by the substrate.

Aspect 79 is the device of any previous or subsequent aspect, further comprising a substrate, wherein the electronic device is disposed adjacent to and supported by the substrate.

Aspect 80 is a device array comprising: a plurality of devices of any previous or subsequent aspect arranged in an array configuration.

Aspect 81 is the device array of any previous or subsequent aspect, wherein at least a subset of the plurality of devices are arranged in a series configuration.

Aspect 82 is the device array of any previous or subsequent aspect, wherein at least a subset of the plurality of devices are arranged in a parallel configuration.

Aspect 83 is the device array of any previous or subsequent aspect, wherein the plurality of devices are arranged in a combination of series and parallel configurations.

Aspect 84 is a device stack comprising: a plurality of device layers arranged in a stacked configuration, wherein each device layer comprises one or more devices of any previous or subsequent aspect.

Aspect 85 is the device stack of any previous or subsequent aspect, wherein each device layer is positioned above and/or below another device layer.

Aspect 86 is the device stack of any previous or subsequent aspect, wherein each device layer corresponds to an array comprising a plurality of the devices.

Aspect 87 is a Casimir cavity comprising: a first reflective layer; a cavity layer; and a second reflective layer, wherein the cavity layer is between the first reflective layer and the second reflective layer, and wherein the cavity layer comprises a solid, a liquid, or a liquid crystal.

Aspect 88 is the Casimir cavity of any previous or subsequent aspect, wherein the cavity layer has a thickness of from 10 nm to 2 µm.

Aspect 89 is the Casimir cavity of any previous or subsequent aspect, wherein the cavity layer comprises a material having a transmittance of greater than 20% for at least some wavelengths of light from 100 nm to 10 µm.

Aspect 90 is the Casimir cavity of any previous or subsequent aspect, wherein the first reflective layer and the second reflective layer each independently have thicknesses of at least 10 nm or from 10 nm to 1 cm.

Aspect 91 is the Casimir cavity of any previous or subsequent aspect, wherein a reflectivity of at least one of the first reflective layer or the second reflective layer is greater than 50%, such as for at least some wavelengths of light from 100 nm to 10 µm.

Aspect 92 is the Casimir cavity of any previous aspect, wherein the first reflective layer and the second reflective layer independently comprise a metal, a dielectric reflector, a diffractive reflector, or an interface between the cavity layer and an adjacent material providing a step in index of refraction.

REFERENCES

U.S. Pat. Nos. 7,379,286, 8,803,340, and 9,581,142.

Atar et al., 2013, "Plasmonically enhanced hot electron based photovoltaic device," Optics Express 21:6, 7196-7201.

Blandford and Thorne, 2008, "Applications of Classical Physics," Lecture Notes Chapter 6, California Institute of Technology, Version 12.

Brongersma, 2015, "Plasmon-induced hot carrier science and technology," Nature Nanotechnology, 10:1, 25-34.

Chalabi et al., 2014, "Hot-electron photodetection with a plasmonic nanostripe antenna," Nano Lett., 14:3, 1374-1380.

Clavero, 2014, "Plasmon induced hot-electron generation at nanoparticle/metal-oxide interfaces for photovoltaic and photocatalytic devices," Nature Photonics, 8:2, 95-103.

Du et al., 2013, "Ultrafast plasmon induced electron injection mechanism in gold-$TiO_2$ nanoparticle system." J. Photochem. and Photobiol. C: Photochem. Revs., 15, 21-30.

Gall, 2016, "Electron mean free path in elemental metals," J. Appl. Phys., 119:8, 085101.

Genet et al., 2003, "Casimir force and the quantum theory of lossy optical cavities," Phys. Rev. A., 67:4, 043811.

Gong et al., 2007, "Design of plasmonic cavities for solid-state cavity quantum electrodynamics applications," Appl. Phys. Lett., 90:3, 033113.

Helman et al., 1973, "Theory of internal photoemission," Phys. Rev. B, 7:8, 3702.

Herner et al., 2017, "High performance MIIM diode based on cobalt oxide/titanium oxide," Appl. Phys. Lett., 110, 223901.

John et al., 2017, "Optical properties of graphene, silicene, germanene, and stanene from IR to far UV—a first principles study," J. Phys. and Chem. of Solids, 110, 307-315.

Kish, 2005, "Stealth communication: Zero-power classical communication, zero-quantum quantum communication and environmental-noise communication," Appl. Phys. Lett., 87:23, 234109.

Kish et al., 2016, "Zero-point term and quantum effects in the Johnson noise of resistors: a critical appraisal," J. Stat. Mech.: Theory and Experiment, 2016:5, 054006.

Knight et al., 2013, "Embedding plasmonic nanostructure diodes enhances hot electron emission," Nano Lett., 13:4, 1687-1692.

Kodama et al., 2001, "Fast heating of ultrahigh-density plasma as a step towards laser fusion ignition," Nature, 412:6849, 798.

Lambe et al., 1976, "Light emission from inelastic electron tunneling," Phys. Rev. Lett., 37:14, 923.

Lebedev et al., 1999, "The dynamics of wire array Z-pinch implosions," Phys. of Plasmas, 6:5, 2016-2022.

McCarthy et al., 1977, "Enhancement of light emission from metal-insulator-metal tunnel junctions," Appl. Phys. Lett., 30:8, 427-429.

Mizuguchi et al., 2007, "Simulation of high-energy proton production by fast magnetosonic shock waves in pinched plasma discharges," Phys. of Plasmas, 14:3, 032704.

Moddel, G. and Dmitriyeva, O., 2019, "Extraction of Zero-Point Energy from the Vacuum: Assessment of Stochastic Electrodynamics-Based Approach as Compared to Other Methods," Atoms, 7(2), 51.

Sze et al., 2006, "Physics of semiconductor devices," John Wiley & Sons, p. 682.

van Dorp et al., 2009, "SiC: a photocathode for water splitting and hydrogen storage," Angewandte Chemie Intl. Ed., 48:33, 6085-6088

Viswanath et al., 2019, "A nanosheet phosphor of double-layered perovskite with unusual intrananosheet site activator concentration," Chem. Eng. J., 122044.

Wang et al., 2000, "Light emission from the double-barrier $Al/Al_2O_3/Al/Al_2O_3/Au$ tunnel junction," Thin Solid Films, 371:1-2, 191-194.

Wang et al., 2011, "Plasmonic energy collection through hot carrier extraction," Nano Lett., 11:12, 5426-5430.

Wang et al., 2017, "Field-assisted splitting of pure water based on deep-sub-debye-length nanogap electrochemical cells," ACS Nano, 11:8, 8421-8428.

Walter et al., 2010, "Solar water splitting cells," Chem. Rev. 110:11, 6446-6473.

Zhu, 2014, "Graphene Geometric Diodes for Optical Rectennas," PhD Thesis, University of Colorado, 68-77.

STATEMENTS REGARDING INCORPORATION BY REFERENCE AND VARIATIONS

All references throughout this application, for example patent documents including issued or granted patents or equivalents, patent application publications, and non-patent literature documents or other source material, are hereby incorporated by reference herein, as though individually incorporated by reference.

All patents and publications mentioned in the specification are indicative of the levels of skill of those skilled in the art to which the invention pertains. References cited herein are incorporated by reference herein to indicate the state of the art, in some cases as of their filing date, and it is intended that this information can be employed herein, if needed, to exclude (for example, to disclaim) specific embodiments that are in the prior art.

When a group of substituents is disclosed herein, it is understood that all individual members of those groups and all subgroups and classes that can be formed using the substituents are disclosed separately. When a Markush group or other grouping is used herein, all individual members of the group and all combinations and subcombinations possible of the group are intended to be individually included in the disclosure. As used herein, "and/or" means that one, all, or any combination of items in a list separated by "and/or" are included in the list; for example "1, 2 and/or 3" is equivalent to "'1' or '2' or '3' or '1 and 2' or '1 and 3' or '2 and 3' or '1, 2 and 3'".

Every formulation or combination of components described or exemplified can be used to practice the invention, unless otherwise stated. Specific names of materials are intended to be exemplary, as it is known that one of ordinary skill in the art can name the same material differently. It will be appreciated that methods, device elements, starting materials, and synthetic methods other than those specifically exemplified can be employed in the practice of the invention without resorting to undue experimentation. All art-known functional equivalents, of any such methods, device elements, starting materials, and synthetic methods are intended to be included in this invention. Whenever a range is given in the specification, for example, a temperature range, a time range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:

1. A device comprising:
   an electronic device; and
   a zero-point-energy-density-reducing structure adjoining the electronic device, the zero-point-energy-density-reducing structure providing an asymmetry with respect to the electronic device that drives a flow of energy across the electronic device.

2. The device of claim 1, wherein at least a portion of the electronic device comprises a component of the zero-point-energy-density-reducing structure.

3. The device of claim 1, wherein the asymmetry produces a net charge flow between a first side of the electronic device and a second side of the electronic device.

4. The device of claim 1, wherein the asymmetry provides a reduction in a zero-point energy density on a first side of the electronic device as compared to the zero-point energy density on the first side of the electronic device in an absence of the zero-point-energy-density-reducing structure.

5. The device of claim 1, wherein the asymmetry provides a difference between a first zero-point energy density on a first side of the electronic device and a second zero-point energy density on a second side of the electronic device that drives the flow of energy.

6. The device of claim 1, wherein a first side of the electronic device corresponds to at least a part of a first conductive layer of the electronic device, and wherein a second side of the electronic device corresponds to at least a part of a second conductive layer of the electronic device.

7. The device of claim 1, wherein the electronic device exhibits a structure that permits transport or capture of charge carriers that pass through the electronic device in 1 ps or less.

8. The device of claim 1, wherein the flow of energy occurs even in the absence of external sources of illumination.

9. The device of claim 1, wherein the zero-point-energy-density-reducing structure comprises a Casimir cavity adjoining the electronic device.

10. The device of claim 9, wherein the electronic device comprises:
 a first conductive layer comprising a component of the Casimir cavity;
 a transport layer disposed adjacent to and in contact with the first conductive layer; and
 a second conductive layer disposed adjacent to and in contact with the transport layer.

11. The device of claim 10, wherein the first conductive layer comprises a metal.

12. The device of claim 10, wherein the transport layer comprises a dielectric.

13. The device of claim 10, wherein the transport layer comprises a semiconductor.

14. The device of claim 10, wherein the first conductive layer has a thickness of from 3 nm to 100 nm.

15. The device of claim 10, wherein the transport layer has a thickness of from 0.3 nm to 50 nm.

16. The device of claim 10, wherein the second conductive layer has a thickness of from 5 nm to 1 cm.

17. The device of claim 10, wherein at least one of the first conductive layer or the second conductive layer comprises a multilayer structure including one or more conductive sub-layers.

18. The device of claim 10, wherein the first conductive layer includes a metamaterial that enhances an optical absorption character of the first conductive layer.

19. The device of claim 10, wherein the first conductive layer includes a metamaterial that enhances hot carrier emission.

20. The device of claim 9, wherein the Casimir cavity comprises:
 a first reflective layer;
 a cavity layer; and
 a second reflective layer, wherein the cavity layer is between the first reflective layer and the second reflective layer.

21. The device of claim 20, wherein the cavity layer has a thickness of from 10 nm to 2 μm.

22. The device of claim 20, wherein the cavity layer comprises a condensed-phase optically transparent material layer.

23. The device of claim 20, wherein the cavity layer comprises a material having a transmittance of greater than 20% for at least some wavelengths of electromagnetic radiation from 100 nm to 10 μm.

24. The device of claim 20, wherein the first reflective layer has a thickness of from 10 nm to 1 cm.

25. The device of claim 20, wherein a reflectivity of at least one of the first reflective layer or the second reflective layer is greater than 50%.

26. The device of claim 20, wherein the first reflective layer comprises a metal.

27. The device of claim 20, wherein the second reflective layer comprises one or more components of the electronic device.

28. The device of claim 1, wherein the electronic device comprises a diode.

29. The device of claim 1, wherein the electronic device comprises a conductive layer adjoining the zero-point-energy-density-reducing structure and a semiconductor layer disposed adjacent to and in contact with the conductive layer.

30. The device of claim 1, further comprising a load positioned to receive electric current from one or more electrically conductive layers of the electronic device.

31. The device of claim 1, further comprising a substrate, wherein the zero-point-energy-density-reducing structure is disposed adjacent to and supported by the substrate.

32. The device of claim 1, further comprising a substrate, wherein the electronic device is disposed adjacent to and supported by the substrate.

33. A device array comprising:
 a plurality of devices of claim 1 arranged in an array configuration.

34. The device array of claim 33, wherein at least a subset of the plurality of devices are arranged in a series configuration.

35. The device array of claim 33, wherein at least a subset of the plurality of devices are arranged in a parallel configuration.

36. The device array of claim 33, wherein the plurality of devices are arranged in a combination of series and parallel configurations.

37. A device stack comprising:
 a plurality of device layers arranged in a stacked configuration, wherein each device layer comprises one or more devices of claim 1.

38. The device stack of claim 37, wherein each device layer corresponds to an array comprising a plurality of the devices.

39. A device comprising:
 an electronic device; and
 a zero-point-energy-density-reducing structure adjoining the electronic device, wherein the electronic device exhibits a structure that permits transport or capture of charge carriers that pass through the electronic device in 1 ps or less.

40. The device of claim 39, wherein the structure permits transport or capture of the charge carriers in 100 fs or less.

41. The device of claim 39, wherein the zero-point-energy-density-reducing structure provides an asymmetry with respect to the electronic device that drives a flow of energy across the electronic device.

42. The device of claim 41, wherein the asymmetry produces a net charge flow between a first side of the electronic device and a second side of the electronic device.

43. The device of claim 41, wherein the asymmetry provides a reduction in a zero-point energy density on a first side of the electronic device as compared to the zero-point energy density on the first side of the electronic device in an absence of the zero-point-energy-density-reducing structure.

44. The device of claim 41, wherein the asymmetry provides a difference between a first zero-point energy density on a first side of the electronic device and a second zero-point energy density on a second side of the electronic device that drives the flow of energy.

45. The device of claim 41, wherein the flow of energy occurs even in the absence of external sources of illumination.

46. The device of claim 41, wherein a first side of the electronic device corresponds to at least a part of a first conductive layer of the electronic device, and wherein a second side of the electronic device corresponds to at least a part of a second conductive layer of the electronic device.

47. The device of claim 39, wherein the zero-point-energy-density-reducing structure comprises a Casimir cavity adjoining the electronic device.

48. The device of claim 47, wherein the electronic device comprises:
a first conductive layer adjacent to the Casimir cavity or comprising a component of the Casimir cavity;
a transport layer disposed adjacent to and in contact with the first conductive layer; and
a second conductive layer disposed adjacent to and in contact with the transport layer.

49. The device of claim 48, wherein the first conductive layer comprises a metal.

50. The device of claim 48, wherein the transport layer comprises a dielectric.

51. The device of claim 48, wherein the transport layer comprises a semiconductor.

52. The device of claim 48, wherein the first conductive layer has a thickness of from 3 nm to 100 nm.

53. The device of claim 48, wherein the transport layer has a thickness of from 0.3 nm to 50 nm.

54. The device of claim 48, wherein the second conductive layer has a thickness of from 5 nm to 1 cm.

55. The device of claim 48, wherein at least one of the first conductive layer or the second conductive layer comprises a multilayer structure including one or more conductive sublayers.

56. The device of claim 48, wherein the first conductive layer includes a metamaterial that enhances an optical absorption character of the first conductive layer.

57. The device of claim 48, wherein the first conductive layer includes a metamaterial that enhances hot carrier emission.

58. The device of claim 47, wherein the Casimir cavity comprises:
a first reflective layer;
a cavity layer; and
a second reflective layer, wherein the cavity layer is between the first reflective layer and the second reflective layer.

59. The device of claim 58, wherein the cavity layer has a thickness of from 10 nm to 2 µm.

60. The device of claim 58, wherein the cavity layer comprises a condensed-phase optically transparent material layer.

61. The device of claim 58, wherein the cavity layer comprises a material having a transmittance of greater than 20% for at least some wavelengths of electromagnetic radiation from 100 nm to 10 µm.

62. The device of claim 58, wherein the first reflective layer has a thickness of from 10 nm to 1 cm.

63. The device of claim 58, wherein a reflectivity of at least one of the first reflective layer or the second reflective layer is greater than 50%.

64. The device of claim 58, wherein the first reflective layer comprises a metal.

65. The device of claim 58, wherein the second reflective layer comprises one or more components of the electronic device.

66. The device of claim 39, wherein the electronic device comprises a diode.

67. The device of claim 39, wherein the electronic device comprises a conductive layer adjoining the zero-point-energy-density-reducing structure and a semiconductor layer disposed adjacent to and in contact with the conductive layer.

68. The device of claim 39, further comprising a load positioned to receive electric current from one or more electrically conductive layers of the electronic device.

69. The device of claim 39, further comprising a substrate, wherein the zero-point-energy-density-reducing structure is disposed adjacent to and supported by the substrate.

70. The device of claim 39, further comprising a substrate, wherein the electronic device is disposed adjacent to and supported by the substrate.

71. A device array comprising:
a plurality of devices of claim 39 arranged in an array configuration.

72. The device array of claim 71, wherein at least a subset of the plurality of devices are arranged in a series configuration.

73. The device array of claim 71, wherein at least a subset of the plurality of devices are arranged in a parallel configuration.

74. The device array of claim 71, wherein the plurality of devices are arranged in a combination of series and parallel configurations.

75. A device stack comprising:
a plurality of device layers arranged in a stacked configuration, wherein each device layer comprises one or more devices of claim 39.

76. The device stack of claim 75, wherein each device layer corresponds to an array comprising a plurality of the devices.

77. A Casimir cavity comprising:
a first reflective layer;
a cavity layer; and
a second reflective layer, wherein the cavity layer is between the first reflective layer and the second reflective layer, and wherein the cavity layer comprises a solid, a liquid, or a liquid crystal.

78. The Casimir cavity of claim 77, wherein the cavity layer has a thickness of from 10 nm to 2 µm.

79. The Casimir cavity of claim 77, wherein the cavity layer comprises a material having a transmittance of greater than 20% for at least some wavelengths of light from 100 nm to 10 µm.

80. The Casimir cavity of claim 77, wherein the first reflective layer and the second reflective layer independently comprise a metal, a dielectric reflector, a diffractive reflector, or an interface between the cavity layer and an adjacent material providing a step in index of refraction.

81. The Casimir cavity of claim 77, wherein a reflectivity of at least one of the first reflective layer or the second reflective layer is greater than 50%.

* * * * *